US012453164B2

(12) United States Patent
Hsieh et al.

(10) Patent No.: US 12,453,164 B2
(45) Date of Patent: Oct. 21, 2025

(54) DIELECTRIC FINS WITH DIFFERENT DIELECTRIC CONSTANTS AND SIZES IN DIFFERENT REGIONS OF A SEMICONDUCTOR DEVICE

(71) Applicant: Taiwan Semiconductor Manufacturing Co., Ltd., Hsin-Chu (TW)

(72) Inventors: Min-Yann Hsieh, Kaohsiung (TW); Hua Feng Chen, Hsinchu (TW); Jhon Jhy Liaw, Zhudong Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 664 days.

(21) Appl. No.: 17/699,329

(22) Filed: Mar. 21, 2022

(65) Prior Publication Data
US 2022/0208615 A1     Jun. 30, 2022

Related U.S. Application Data

(62) Division of application No. 16/577,927, filed on Sep. 20, 2019, now Pat. No. 11,282,751.

(60) Provisional application No. 62/750,948, filed on Oct. 26, 2018.

(51) Int. Cl.
| | |
|---|---|
| *H10D 84/03* | (2025.01) |
| *H01L 21/3105* | (2006.01) |
| *H01L 21/762* | (2006.01) |
| *H10D 84/01* | (2025.01) |
| *H10D 84/83* | (2025.01) |

(52) U.S. Cl.
CPC ..... *H10D 84/038* (2025.01); *H01L 21/31053* (2013.01); *H01L 21/762* (2013.01); *H10D 84/0151* (2025.01); *H10D 84/834* (2025.01)

(58) Field of Classification Search
CPC ......... H01L 21/823431; H01L 27/0886; H01L 21/76224; H01L 21/823481; H10D 84/0158; H10D 84/038; H10D 84/0151; H10D 84/834; H10D 30/0243
See application file for complete search history.

(56) References Cited

U.S. PATENT DOCUMENTS

| | | |
|---|---|---|
| 8,605,523 B2 | 12/2013 | Tao et al. |
| 8,630,132 B2 | 1/2014 | Cheng et al. |
| 8,760,948 B2 | 6/2014 | Tao et al. |

(Continued)

FOREIGN PATENT DOCUMENTS

| | | |
|---|---|---|
| CN | 106684087 A | 5/2017 |
| KR | 20160110053 A | 9/2016 |

*Primary Examiner* — Samuel A Gebremariam
*Assistant Examiner* — Jonas T Beardsley
(74) *Attorney, Agent, or Firm* — HAYNES AND BOONE, LLP

(57) ABSTRACT

A semiconductor device includes. A first epi-layer and a second epi-layer are each located in a first region of the semiconductor device. A first dielectric fin is located between the first epi-layer and the second epi-layer. The first dielectric fin has a first dielectric constant. A third epi-layer and a fourth epi-layer are each located in a second region of the semiconductor device. A second dielectric fin is located between the third epi-layer and the fourth epi-layer. The second dielectric fin has a second dielectric constant that is less than the first dielectric constant.

20 Claims, 19 Drawing Sheets

(56) References Cited

U.S. PATENT DOCUMENTS

| | | |
|---|---|---|
| 9,748,245 B1 | 8/2017 | Cheng et al. |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0231919 A1* | 8/2014 | Peng ................. H10D 89/10 |
| | | 257/368 |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2015/0144998 A1* | 5/2015 | Ching ............... H10D 62/021 |
| | | 257/190 |
| 2015/0206877 A1 | 7/2015 | He et al. |
| 2016/0099352 A1 | 4/2016 | Lee et al. |
| 2016/0163826 A1 | 6/2016 | Cheng et al. |
| 2016/0268257 A1 | 9/2016 | Lim et al. |
| 2017/0012042 A1* | 1/2017 | Cai .................... H10D 84/834 |
| 2017/0133275 A1 | 5/2017 | Kim et al. |
| 2017/0243944 A1 | 8/2017 | Li et al. |
| 2018/0323281 A1 | 11/2018 | Cheng et al. |
| 2019/0081180 A1 | 3/2019 | Park et al. |
| 2019/0164890 A1* | 5/2019 | Yeoh ................. H01L 21/31144 |
| 2019/0305111 A1 | 10/2019 | Subramanian et al. |
| 2020/0119010 A1 | 4/2020 | Lee et al. |

* cited by examiner

Top View

DIELECTRIC FINS WITH DIFFERENT DIELECTRIC CONSTANTS AND SIZES IN DIFFERENT REGIONS OF A SEMICONDUCTOR DEVICE

PRIORITY DATA

The present application is a divisional U.S. patent application of U.S. patent application Ser. No. 16/577,927, filed on Sep. 20, 2019, which is a U.S. Utility patent application of U.S. Provisional patent application No. 62/750,948, filed on Oct. 26, 2018, the disclosures of which are hereby incorporated by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of processing and manufacturing ICs and, for these advances to be realized. Similar developments in IC processing and manufacturing are needed. For example, a three-dimensional transistor, such as a fin-like field-effect transistor (FinFET), has been introduced to replace a planar transistor. FinFETs provide reduced short channel effects, reduced leakage, and higher current flow. In other words, they may be faster, smaller, and more efficient than planar devices.

Despite the advantages, existing FinFET devices may still need certain improvements. For example, dielectric structures such as dielectric fins may be formed to tune an overall fin pattern density, reinforce the mechanical strength of the device fins, and/or enhance the manufacturing capability. A given IC chip may include different types of semiconductor devices located in different regions, where the dielectric fins may serve different utilities in these different regions. As such, it may be desirable to configure the dielectric fins in different regions of an IC to have different characteristics, such as different dielectric constants and/or different heights or widths. However, conventional ICs typically have a "one-size-fits-all" approach with respect to the implementation of dielectric fins, which does not optimize the performance of the conventional ICs.

Therefore, while existing FinFET devices and the fabrication thereof have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
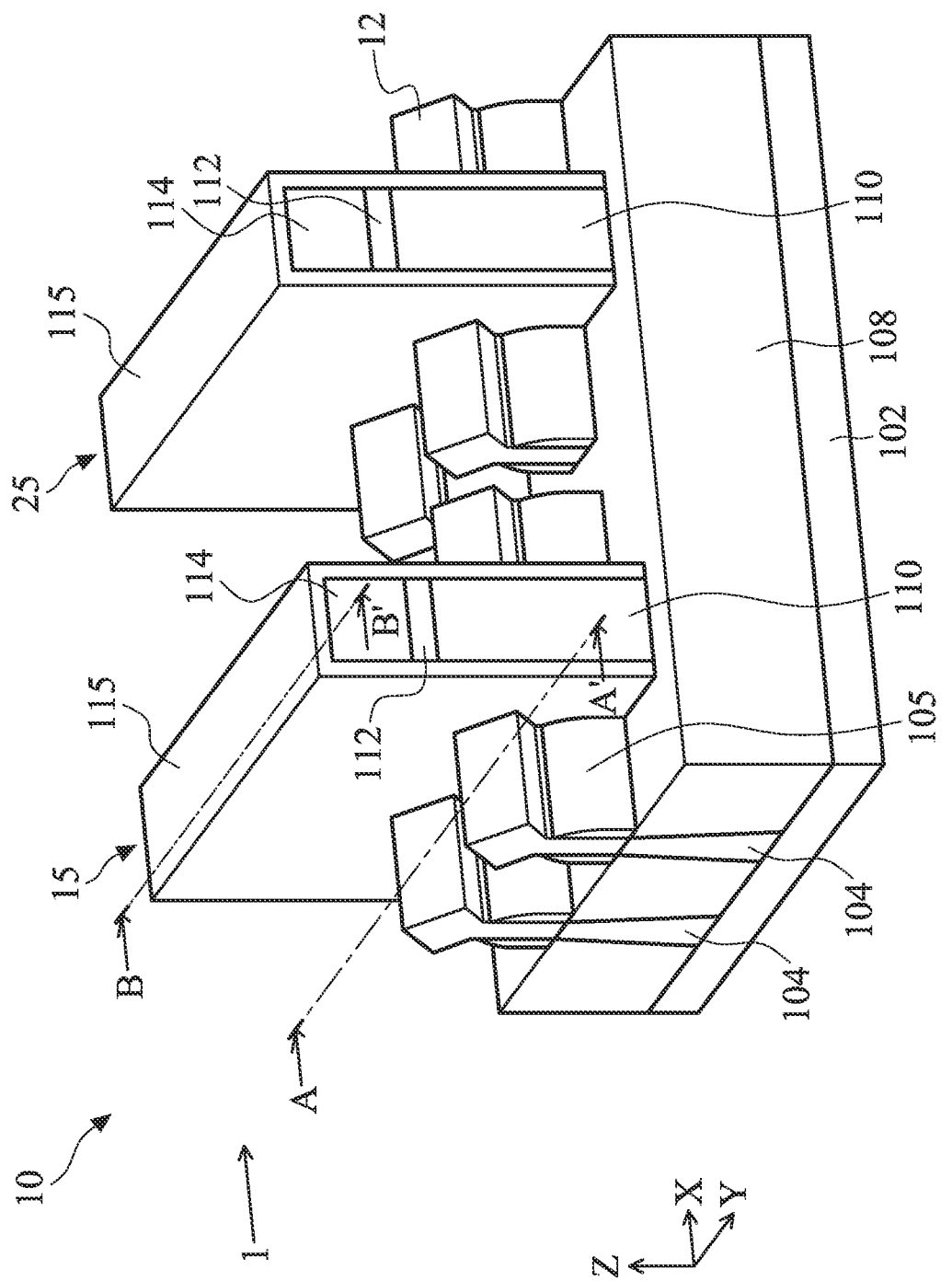
FIG. 1 is a perspective view of an example FinFET transistor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The semiconductor industry has progressed into nanometer technology process nodes in pursuit of higher device density, higher performance, and lower costs. To realize these improvements, the use of FinFET devices has been gaining popularity in the semiconductor industry. The present disclosure is directed to, but not otherwise limited to, a method of forming dielectric fins in different regions of a wafer in order to simultaneously optimize device performance and reduce transistor bridging or electrical shorting concerns.

To illustrate the various aspects of the present disclosure, a FinFET fabrication process is discussed below as an example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed.

Referring to FIG. 1, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, conventional FinFET fabrication may still need improvement. For example, FinFET device fabrication may involve forming a dielectric structure such as a dielectric fin to tune an overall fin pattern density, reinforce the mechanical strength of the device fins, and/or enhance the manufacturing capability. However, an IC chip may include different types of devices with different functionalities, designs, and/or concerns, which have not been simultaneously met by the dielectric structure. For example, an IC chip may include logic devices, such as core and input/output (I/O) devices, as well as memory devices such as Static Random Access Memory (SRAM) devices. Compared to SRAM devices, logic devices may need to have larger source/drain epi-layers in order to optimize performance and/or handle the input/out signals. However, when the dielectric structures such as dielectric fins are formed between the source/drain epi-layers, they could potentially restrict the lateral epitaxial growth of the source/drain epi-layers. When this occurs, the reduced size of the source/drain epi-layers may adversely impact the performance of the logic devices. In addition, the restricted lateral growth of the source/drain epi-layers may also result in a reduced silicide area, as well as a smaller landing area for the conductive contacts to be formed thereon. For these reasons, it may be beneficial to reduce the height of the dielectric structures, so that the lateral growth of the source/drain epi-layers for the logic devices is not constrained.

In comparison to the logic devices, SRAM devices may be smaller and may place a higher consideration on density. In other words, it is desirable to implement a large number of SRAM transistors within a given unit area. As such, the presence of the dummy structures typically does not pose a problem, since the lateral growth of the source/drain epi-layers of the SRAM transistors is not as important as it is for the logic devices. However, if the height of the dielectric structures is reduced, then bridging concerns may arise. Stated differently, the source/drain epi-layers from adjacent transistors may grow into each other. This may cause electrical shorting between the adjacent transistors, which could adversely affect the operation of the SRAM device or even render the SRAM device defective. Note that the bridging concerns (if the dummy structures are too short) may apply to other non-SRAM devices that also need a tighter layout. For example, for some logic devices, pattern density is a greater priority than performance (e.g., speed or power). Therefore, bridging or electrical shorting may be a concern for these types of logic devices too.

To overcome the problems discussed above, the present disclosure utilizes a plurality of processing steps to form dummy dielectric structures that have different sizes/shapes and dielectric constants in different regions of a wafer. For example, the dummy dielectric structures formed in a memory device region (or another region that has a greater pattern density) has a tall and narrow dielectric fin structure with a relatively high dielectric constant, whereas the dummy dielectric structures formed in a logic device region (or another region that has a lower pattern density) has a short and wide dielectric fin structure with a relatively low dielectric constant. As a result, the respectively priorities/objectives for the different IC regions can be achieved simultaneously. The various aspects of the present disclosure will now be discussed below in more detail with reference to FIGS. 2-18.

Figure 2:
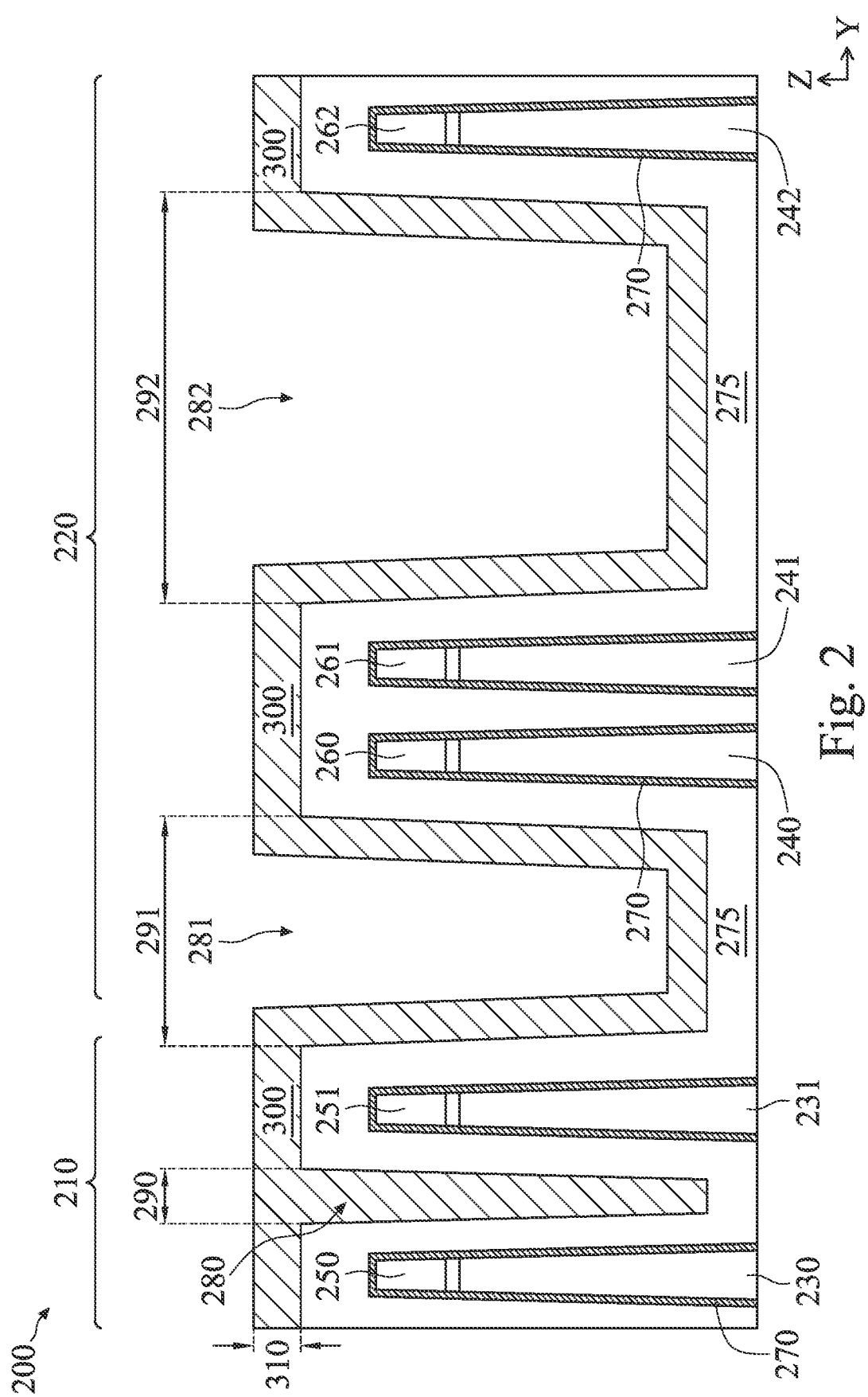
FIGS. 2-16 illustrate cross-sectional side views of a semiconductor device at various stages of fabrication according to various embodiments of the present disclosure.

FIGS. 2-13 illustrate cross-sectional views of a semiconductor device 200 at different stages of fabrication according to an embodiment. Referring to FIG. 2, the semiconductor device 200 may be a portion of an IC chip and may include different types of semiconductor devices located in different regions. As an example, the semiconductor device 200 includes a memory device region 210 and a logic device region 220. In some embodiments, the memory device region 210 may include Static Random Access Memory (SRAM) devices, and the logic device region 220 may include input/output (I/O) devices or core devices. The details of an example SRAM device are discussed in U.S. patent application Ser. No. 15/636,832, entitled "Preventing Gate-to-Contact Bridging by Reducing Contact Dimensions in FinFET SRAM", the disclosure of which is hereby incorporated by reference in its entirety.

It is understood that although the memory device region 210 and the logic device region 220 are illustrated as being disposed adjacent to one another herein, it is not required. In other words, the memory device region 210 and the logic device region 220 may be disposed far apart from one another (or separated by other regions or components) in various embodiments.

Both the memory device region 210 and the logic device region 220 are formed over a substrate (not specifically illustrated herein for reasons of simplicity). The substrate may include a bulk silicon substrate in some embodiments. In other embodiments, the substrate may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In further embodiments, the substrate may include a silicon-on-insulator (SOI) substrate. SOI substrates are fabricated using separation by implantation of oxygen, wafer bonding, and/or other suitable methods. The substrate may also include various isolation features, such as shallow trench isolation (STI) features and active regions defined by the STI features.

The memory device region 210 and the logic device region 220 may have varying degrees of layout density. For example, the memory device region 210 may have a relatively high layout density, and the spacing between adjacent transistor components may be relatively narrow (e.g., narrower than in the logic device region 220). Conversely, the logic device region 220 may have a relatively low layout density, and the spacing between adjacent transistor components in the logic device region 220 may be greater than in the memory device region 210. Due to the difference in layout density or spacing between components in the regions 210 and 220, the memory device region 210 may be referred to as a dense region, and the logic device region 220 may be referred to as a sparse region. In some embodiments, the pattern density of the memory device region 210 is at least twice as high as the pattern density of the logic device region 220 (e.g., at least twice the number of transistors per unit area).

Both the memory device region 210 and the logic device region 220 include active regions. In some embodiments, the active regions may vertically protrude as a non-planar structure above the substrate (and above isolation features such as STI), for example as fin structures 230-231 in the memory device region 210 and as fin structures 240-242 in the logic device region 220. Similar to the fin structures 104 of FIG. 1, the fin structures 230-231 and 240-242 each extend in an elongated manner horizontally in the X-direction and protrude vertically upwards in the Z-direction. The fin structures 230-231 and 240-242 are also spaced apart from one another in the Y-direction. The fin structures 230-231 and 240-242 may include a semiconductor material such as silicon (Si) or silicon germanium (SiGe), or a III-V group compound such as gallium arsenide (GaAs), indium gallium arsenide (InGaAs), indium phosphide (InP), etc. Some of the fin structures may be n-type fin structures, for example the fin structures 230-231 and 242 may be n-type fin structures. Other fin structures may be p-type fin structures, for example the fin structures 240-241 may be p-type fin structures. It is understood that these are just non-limiting examples. For ease of reference, the fin structures 230-231 and 240-242 may be interchangeably referred to as device fins or active fins hereinafter, to be differentiated from the dielectric fins discussed below.

The fin structures 230-231 and 240-242 may be formed by a patterning process using hard masks 250-251 and 260-262. Each of the hard masks 250-251 and 260-262 patterns one of the fin structures 230-231 and 240-242 below, respectively. The hard masks 250-251 and 260-262 may include a dielectric material. Spacers 270 may also be formed on each of the fin structures 230-231 and 240-242. The spacers 270 may include a dielectric material such as a low-k dielectric material, silicon oxide, silicon nitride, etc. A layer 275 is formed over the fin structures 230-231 and 240-242 (and over the spacers 270). The layer 275 may include a dielectric material and may be formed by a deposition process, such as CVD, PVD, ALD, etc. The layer 275 may serve as an isolation structure such as an STI structure, and it may include a single layer or multiple layers. The layer 275 may include silicon oxide in some embodiments but may also include other materials in other embodiments. The material composition of the layer 275 may be configured such that it has an etching selectivity with a subsequently-formed dielectric layer 300 (formed over the layer 275 and discussed in more detail below).

The deposition of the layer 275 forms trenches in the semiconductor device 200, for example trenches 280, 281, and 282 as shown in FIG. 2. The trench 280 may be considered to be formed in the memory device region 210, while the trenches 281-282 may be considered to be formed in the logic device region 220. The trenches 280-282 also have lateral dimensions 290-292 (e.g., measured in the Y-direction), respectively. In some embodiments, each of the dimensions 290-292 may represent the maximum (e.g., the widest) lateral dimension of the respective trench. Due to the different layout densities or spacings between elements in the memory device region 210 and the logic device region 220, the dimension 290 is substantially smaller than the dimensions 291-292. In some embodiments, the dimensions 291 and 292 may each be at least twice as long as the dimension 290.

Still referring to FIG. 2, a high-k dielectric layer 300 is formed in both the memory device region 210 and the logic device region 220. The high-k dielectric layer 300 may be formed by a deposition process such as CVD, PVD, ALD, or combinations thereof. In some embodiments, the high-k dielectric layer 300 has a dielectric constant that is between about 4 and about 10, for example the high-k dielectric layer 300 may include $Si_3N_4$ or $Al_2O_3$. In some other embodiments, the high-k dielectric layer 300 has a dielectric constant that is greater than about 10, for example the high-k dielectric layer 300 may include $La_2O_3$, $Y_2O_3$, $ZrO_2Ta_2O_5$, $HfO_2HfSiO_4$, $TiO_2$, $\alpha$-$LaAlO_3$, or $SrTiO_3$. As shown in FIG. 2, due to the differences in the dimensions 290-292, the high-k dielectric layer 300 completely fills the trench 280 in the memory device region 210 but fills in the trenches 281-282 partially in the logic device region 220. This may be achieved by configuring the deposition process parameters (such as process duration) of the high-k dielectric layer 300 such that it has a thickness 310 that is greater than two times the dimension 290. The portion of the high-k dielectric layer 300 filling the trench 280 will form a dielectric fin in the memory device region 210, as discussed below in more detail.

Figure 3:
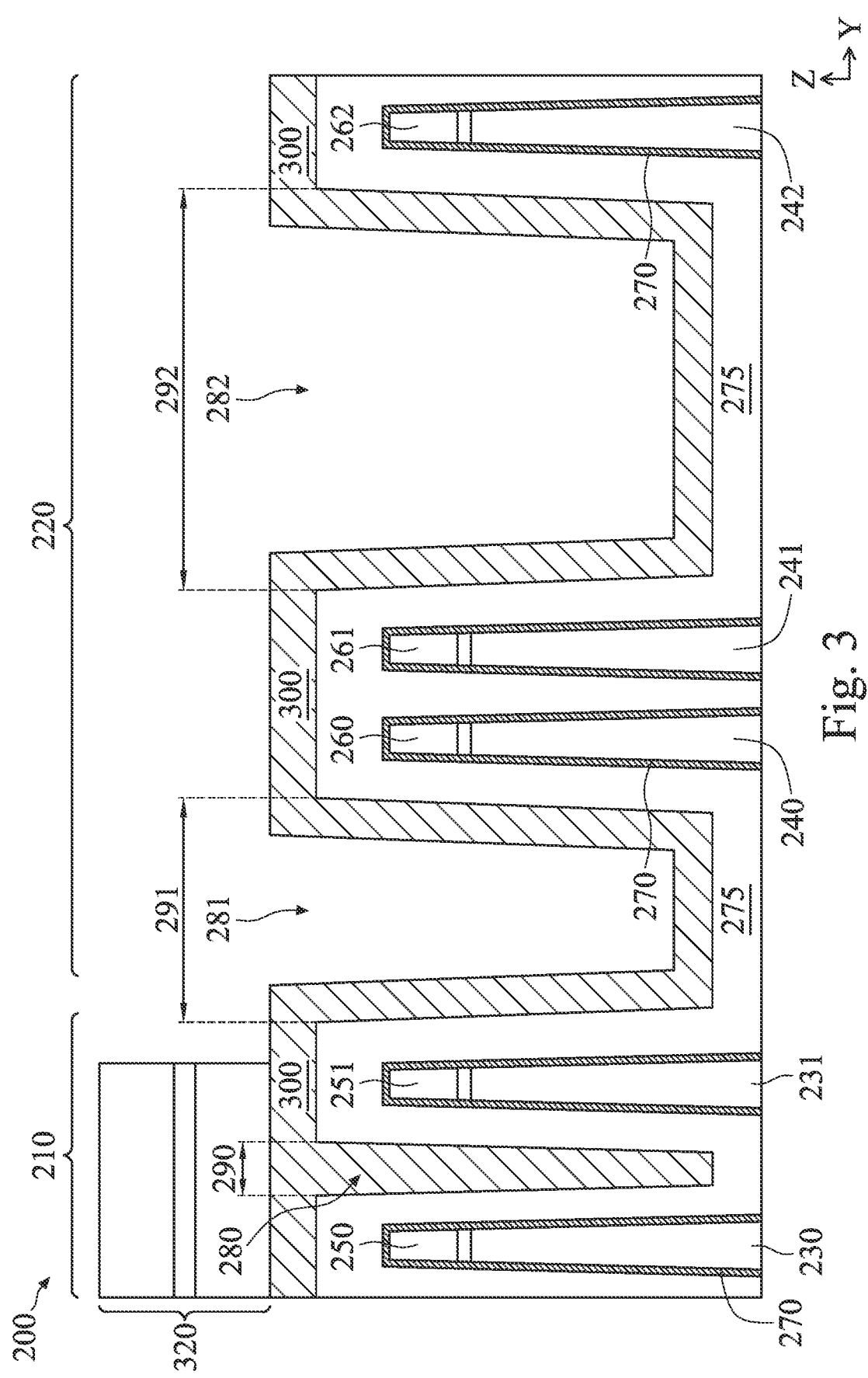

Referring now to FIG. 3, a photoresist mask 320 is formed in the memory device region 210, for example over a portion of the high-k dielectric layer 300 covering the trench 280. The photoresist mask 320 may be formed via a lithography process that includes steps such as photoresist coating (e.g., spin-on coating), soft baking, mask aligning, exposure, post-exposure baking, photoresist developing, rinsing, drying (e.g., hard baking), etc. In some embodiments, the photoresist mask 320 may include a tri-layer photoresist with a bottom layer (BL layer), a middle layer (ML), and a top layer (PR).

Figure 4:
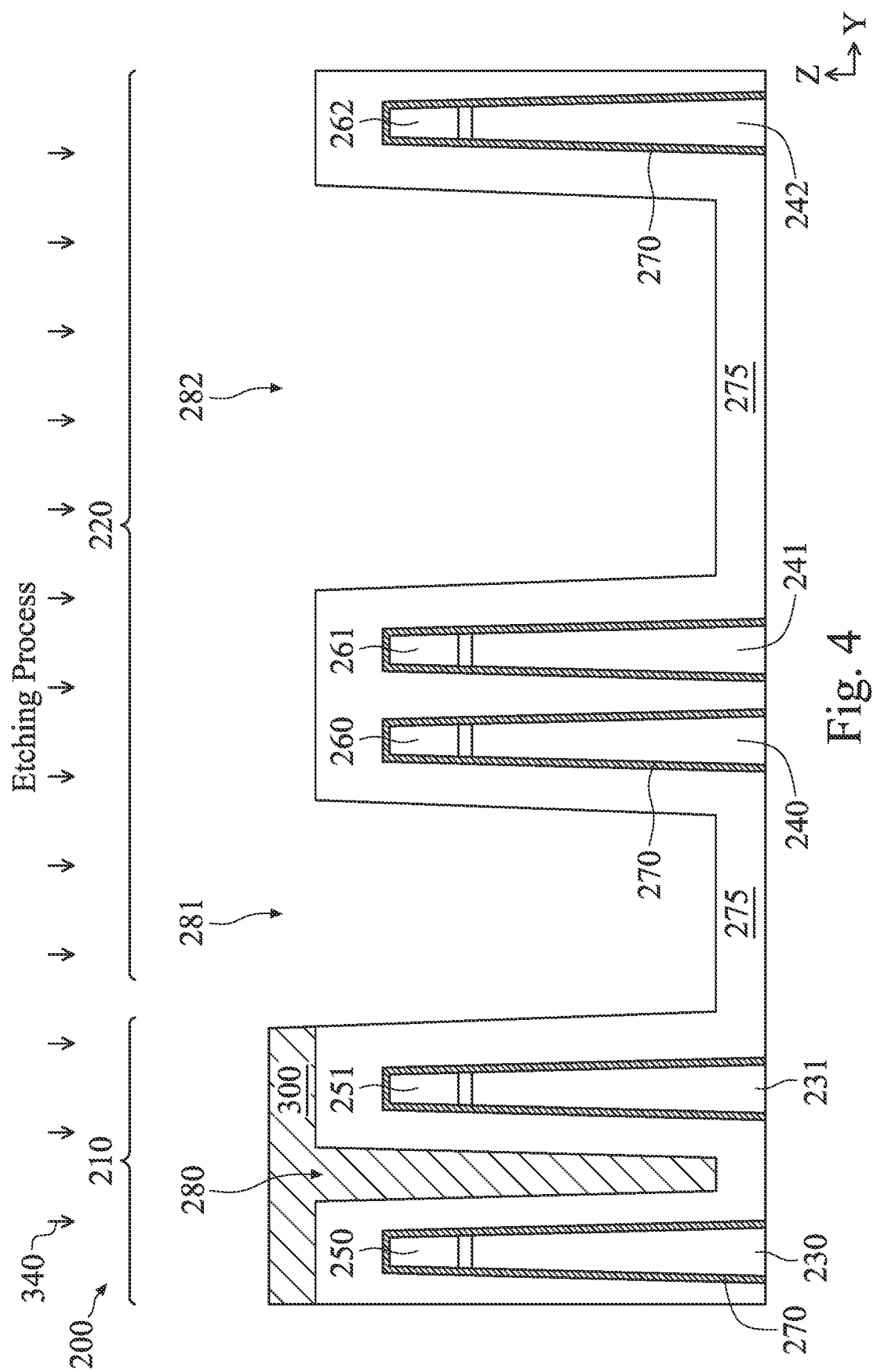

Referring now to FIG. 4, an etching process 340 is performed to the semiconductor device 200. The photoresist mask 320 protects the portion of the high-k dielectric layer 300 below from being etched during the etching process 340, but the absence of the photoresist mask 320 exposes the portions of the high-k dielectric layer 300 in the logic device region 220. As a result, the high-k dielectric layer 300 in the trenches 281-282 are etched away, while the high-k dielectric layer 300 in the trench 280 still remains after the etching process 340 is performed. The photoresist mask 320 is then removed, for example using a photoresist stripping or ashing process.

Figure 5:
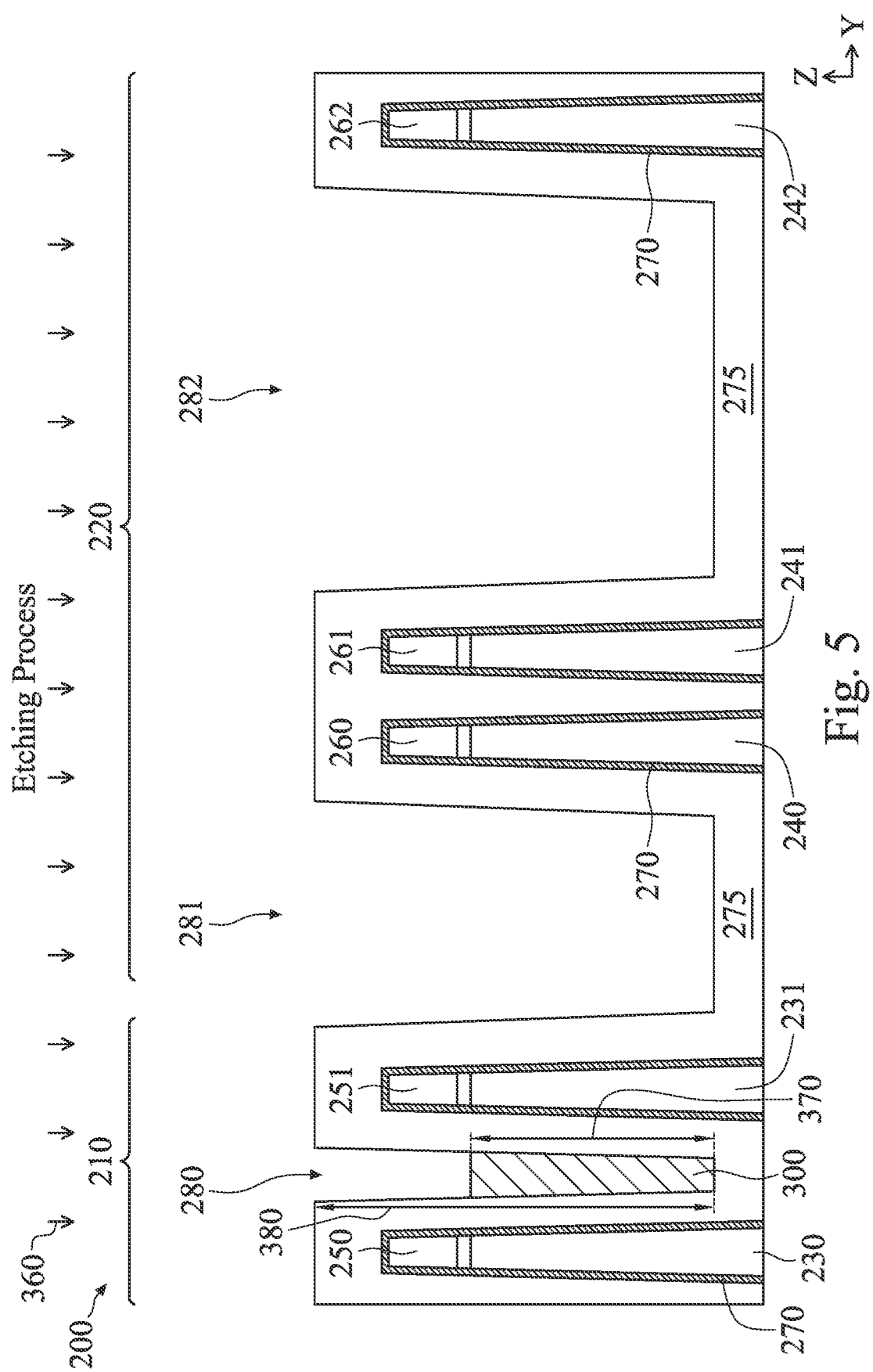
Figure 6:
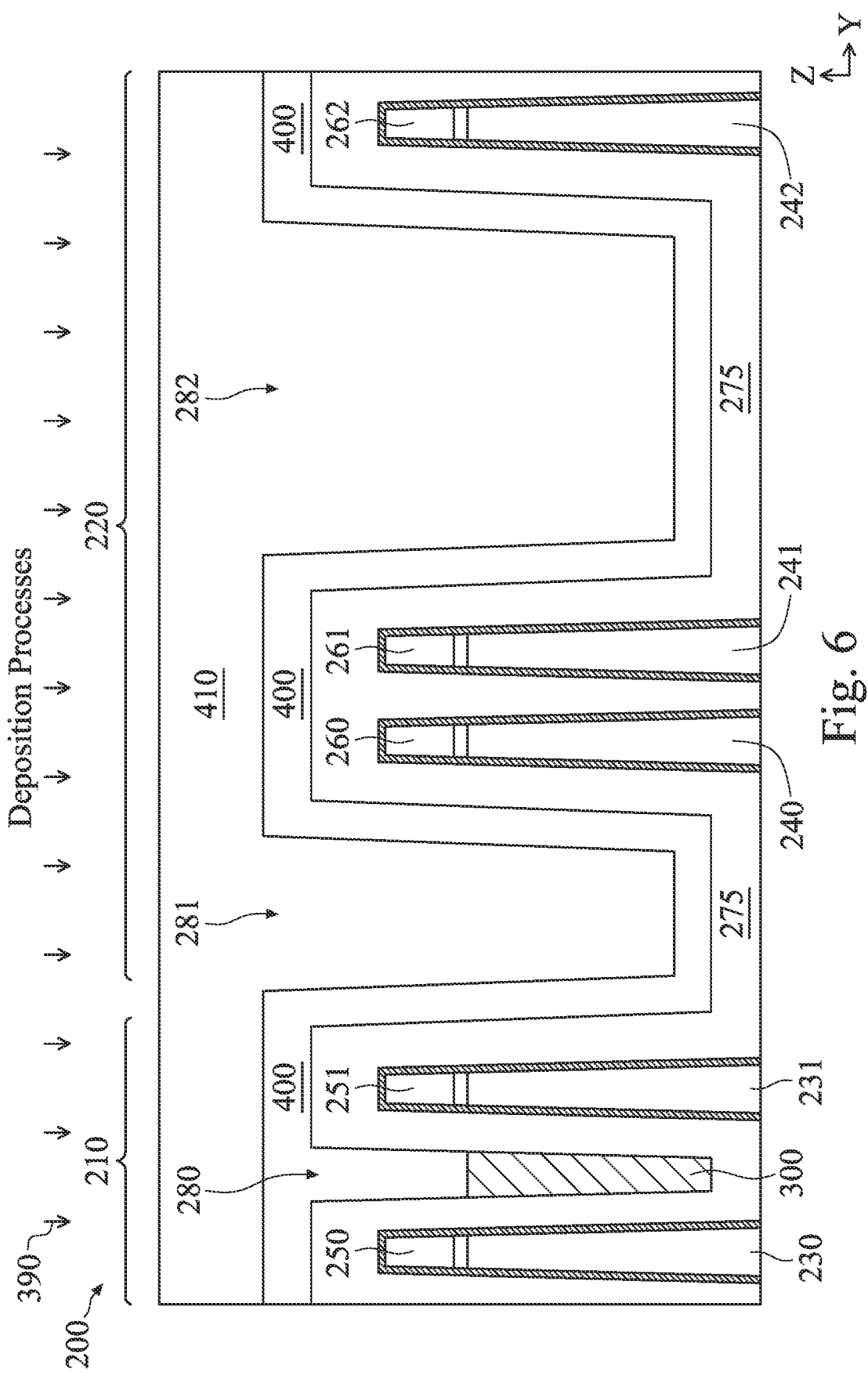

Referring now to FIG. 5, another etching process 360 is performed to the semiconductor device 200. The etching process 360 may include a wet etching process or a dry etching process. The etching process 360 is configured to partially remove the portion of the high-k dielectric layer 300 that is still remaining. In order to remove the high-k dielectric layer 300 without substantially affecting the layer 275, the etching process 360 may use an etchant that has a high etching selectivity between the high-k dielectric layer 300 and the layer 275. In other words, the etchant is configured such that the high-k dielectric layer 300 is etched away at a substantially faster rate (e.g., five time or more) than the layer 275.

A height 370 (measured in the Z-direction) of the remaining portion of the high-k dielectric layer 300 that is partially filling the trench 280 can be controlled by adjusting certain process parameters of the etching process 360, for example by increasing or reducing the etching duration. A longer etching duration results in a smaller height 370, while a shorter etching duration results in a taller height 370. In any case, the height 370 is shorter than a height 380 of the trench 280 after the performance of the etching process 360. After the etching process 360, the portion of the high-k dielectric layer 300 partially filling the trench 280 may be referred to as a high-k fin 300.

Though FIGS. 3-5 illustrate an embodiment in which the photoresist mask 320 is used to help form a high-k fin 300 in the memory device region 210, it is understood the use of a photoresist mask is not required. In some alternative embodiments, the parameters of an etching process (such as the etching process 360) may be configured to cause a substantially complete removal of the high-k dielectric layer 300 in the logic device region 220, while leaving a portion of the high-k dielectric layer 300 intact in the memory device region 210. In such embodiments, even without the formation of the patterned photoresist mask, a high etching selectivity between the material of the high-k dielectric layer 300 and the layer 275 will lead to a substantial removal of the high-k dielectric layer 300 without significantly damaging the layer 275 below.

In addition, the portions of the high-k dielectric layer 300 in the logic device region 220 have a thickness 310 (see FIG. 2), which is substantially less than the effective thickness of the portion of the high-k dielectric layer 300 in the memory device region 210, which is the height of the portion of the high-k dielectric layer 300 filling the trench 280. As such, an etching process similar to the etching process 360 may be able to completely etch away the portions of the high-k dielectric layer 300 in the logic device region 220 (to the point where the layer 275 is exposed), while the portion of the high-k dielectric layer 300 in the memory device region 210 is partially removed. Again, the height 370 of the high-k fin 300 in the memory device region 210 may be flexibly adjusted by tuning process parameters such as etching time of the etching process 360.

After the formation of the high-k fin 300 (regardless of the embodiment used) in the memory device region 210, the fabrication of the semiconductor device 200 may proceed to the formation of hybrid fins in the logic device region 220. For example, referring now to FIG. 6, a plurality of deposition processes 390 are performed to form a layer 400 and a layer 410. The layer 400 is formed over the layer 275 and partially fills the trenches 280-282 in a first one of the deposition processes 390. The portion of the layer 400 formed in the memory device region 210 is formed on top of the high-k fin 300, while the portions of the layer 400 formed in the logic device region 220 may be formed conformally on the upper surfaces and side surfaces of the layer 275. In some embodiments, the layer 400 includes a dielectric material having a dielectric constant less than that of the high-k fin 300. For example, the layer 400 may include a dielectric material having a dielectric constant in a range between about 4 and about 10. Such a dielectric constant range may be achieved and/or configured by doping certain elements into the layer 400. In some embodiments, the dielectric material of the layer 400 may include a doped SiCON or a doped SiCN.

A second one of the deposition processes 390 then deposits the layer 410 over the layer 400. In some embodiments, the layer 410 may be formed using a flowable chemical vapor deposition process (FCVD) and may include a dielectric material having a dielectric less than about 5. For example, the layer 410 may include silicon oxide, which has a dielectric constant slightly less than 4 (e.g., between about 3.7 and about 3.9). The combination of the layers 400 and 410 may form a hybrid fin with a lower overall dielectric constant than the high-k fin 300, as discussed below in more detail.

Figure 7:
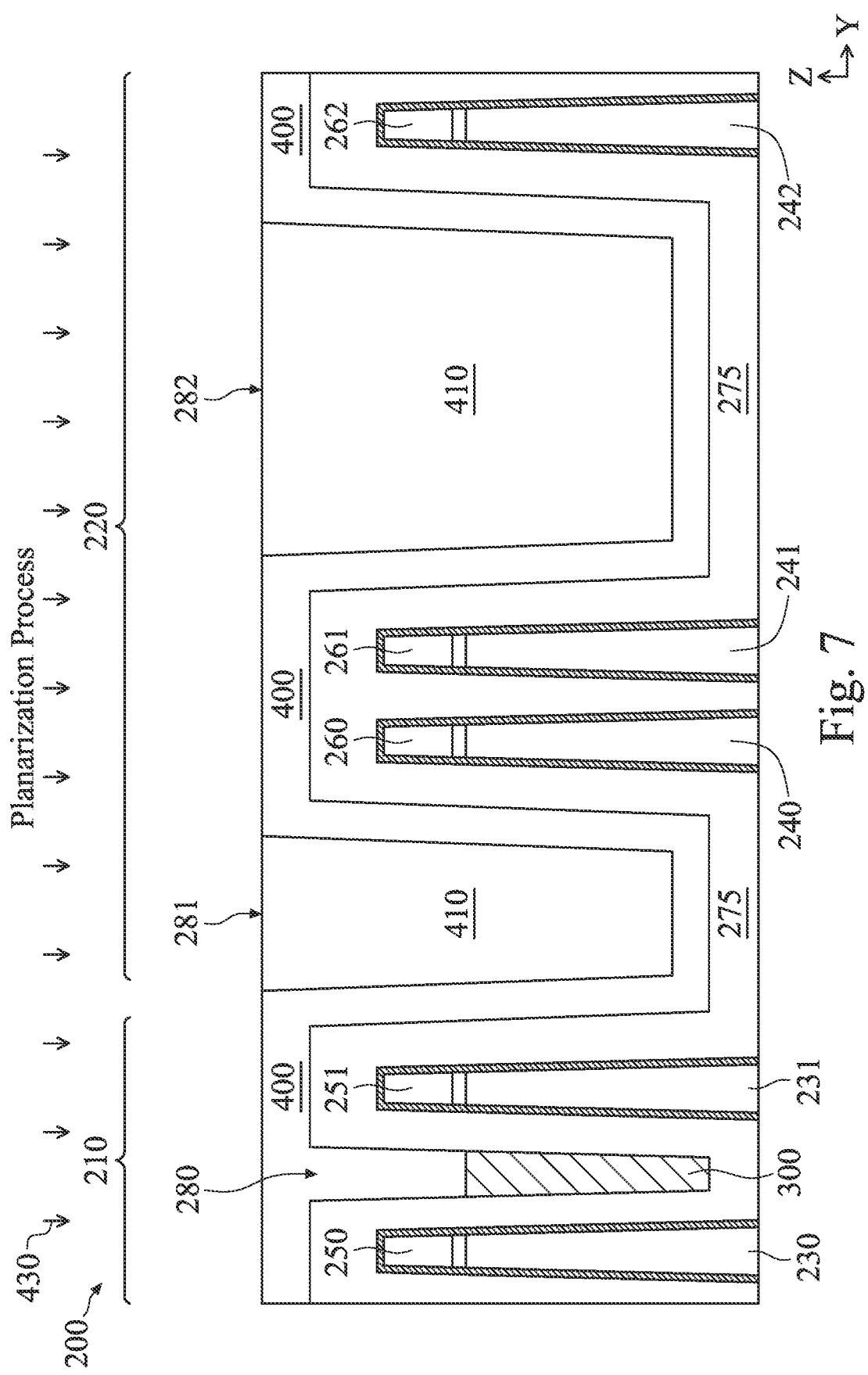

Referring now to FIG. 7, a planarization process 430 is performed to the semiconductor device 200 to polish and planarize the layer 410. In some embodiments, the planarization process 430 includes a chemical mechanical polishing (CMP) process. A substantial portion of the layer 410 is polished away until the layer 400 is reached. In other words, the layer 400 serves as a polishing-stop layer for the planarization process 430. The remaining portions of the layer 410 fill the trenches 281 and 282 and have substantially planar (or flat) upper surfaces.

Figure 8:
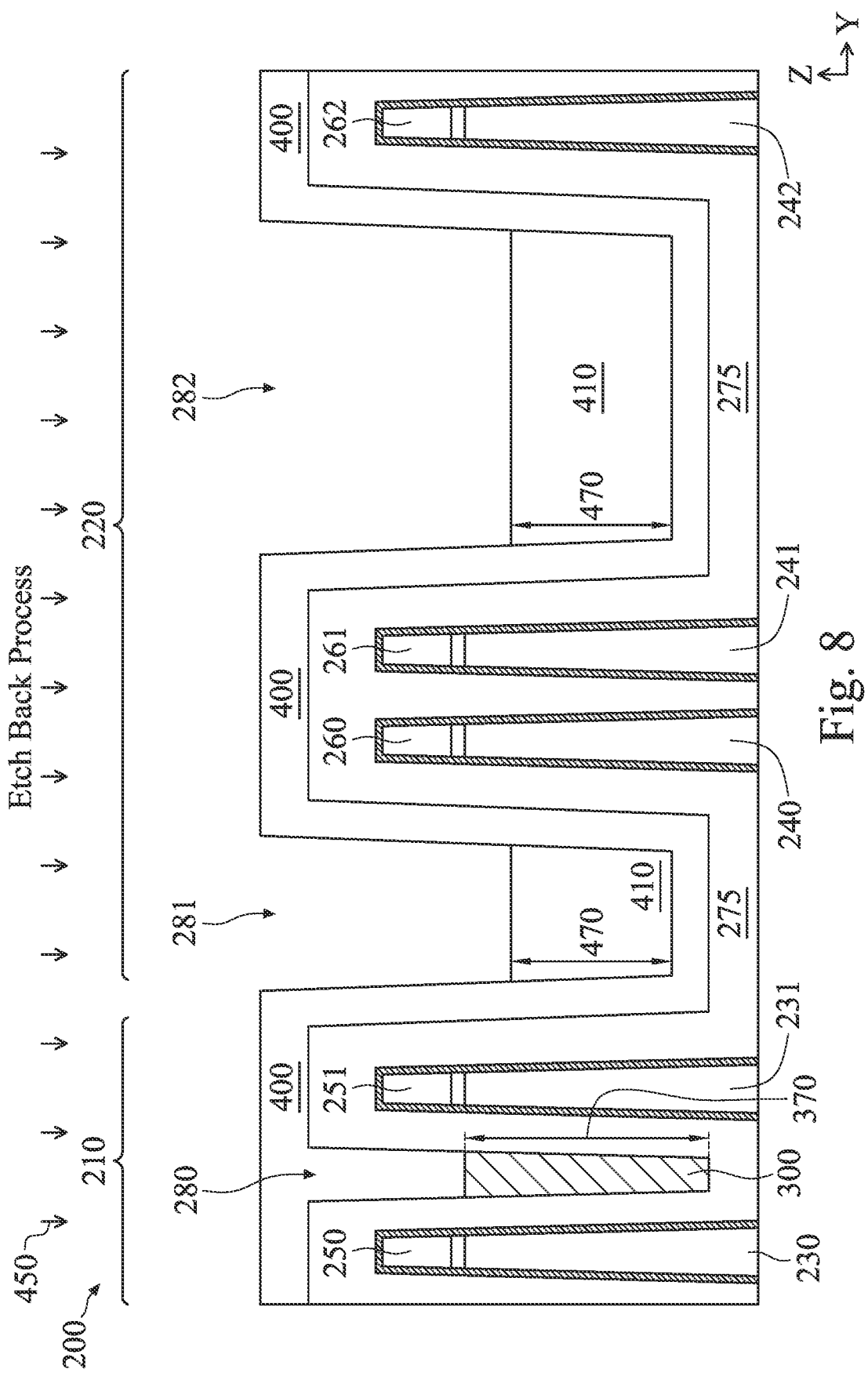

Referring now to FIG. 8, an etch back process 450 is performed to the semiconductor device 200. The process parameters of the etch back process 450 are configured such that an etching selectivity exists between the layer 410 and the layer 400, such that the layer 410 is etched away in a substantially uniform manner while not significantly affecting the layer 400. A height 470 of the remaining portions of the layer 410 in the trenches 281-282 may also be controlled by adjusting the parameters of the etch back process 450, for example by increasing or reducing the etching duration. The height 470 is configured to be less than the height 370 of the high-k fin 300. As discussed in more detail below, the difference between the height 470 and the height 370 will facilitate the formation of different structures having different heights in the memory device region 210 and the logic device region 220, since these structures will serve different purposes in the memory device region 210 and the logic device region 220.

Figure 9:
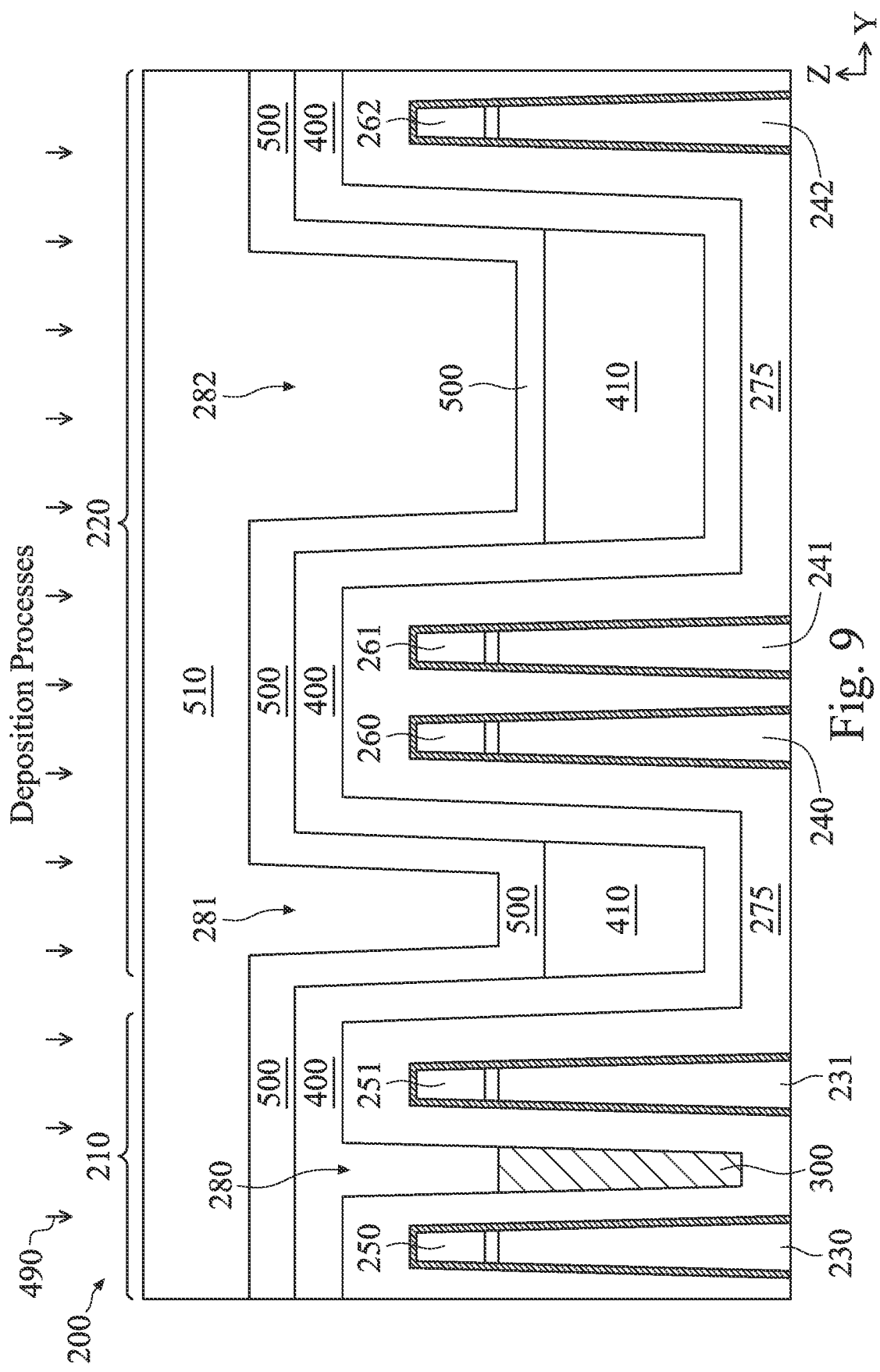

Referring now to FIG. 9, a plurality of deposition processes 490 are performed to form a layer 500 and a layer 510. The layer 500 is formed over the layers 400 and 410 and partially fills the trenches 281-282 in a first one of the deposition processes 490. In some embodiments, the layer 500 includes a dielectric material having a dielectric constant less than that of the high-k fin 300. For example, the layer 400 may include a dielectric material having a dielectric constant in a range between about 4 and about 10. In some embodiments, the layers 400 and 500 are formed to have the same type of dielectric material(s). In some embodiments, the portion of the layer 500 in the trench 281 and the portion of the layer 500 in the trench 282 have substantially identical thicknesses.

A second one of the deposition processes 490 deposits the layer 510 over the layer 500. In some embodiments, the layer 510 may be formed using FCVD and may include a dielectric material having a dielectric less than about 5. In some embodiments, the layers 410 and 510 are formed to have the same type of dielectric material(s), such as silicon oxide.

Figure 10:
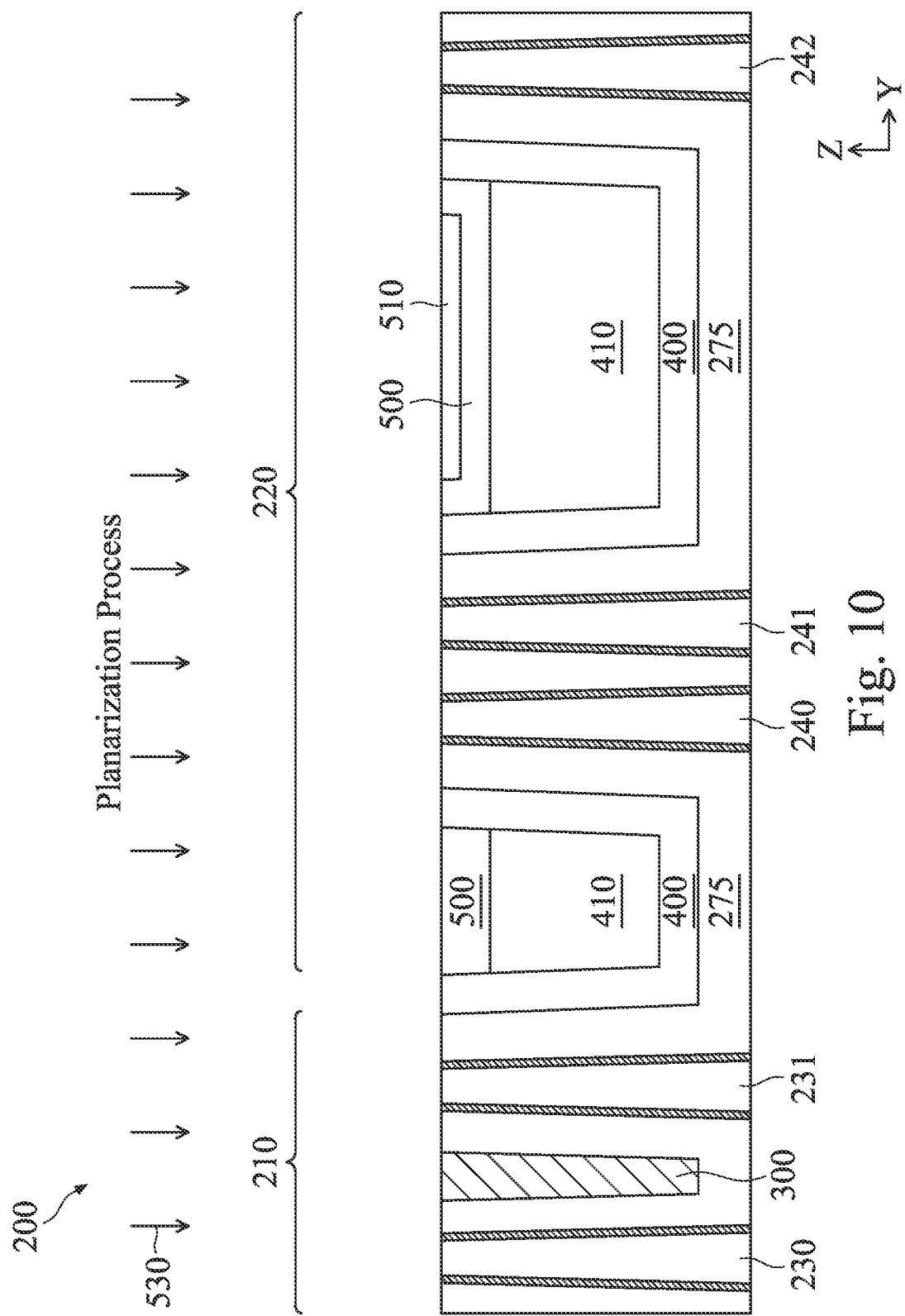

Referring now to FIG. 10, a planarization process 530 is performed to the semiconductor device 200 to polish and planarize various layers located above the fin structures 230-231 and 240-242. In some embodiments, the planarization process 530 includes a CMP process. Portions of the layers 510, 500, 400, and 275, as well as the hard masks 250-251 and 260-262, are polished and grinded away until the fin structures 230-231 and/or 240-242 are reached. In other words, the fin structures 230-231 and 240-242 serve as polishing-stop layers for the planarization process 530. Hence, the planarization process 530 exposes the upper surfaces of the fin structures 230-231 and 240-242, as well as the upper surfaces of the high-k fin 300 and the layers 400, 500, and 510.

Figure 11:
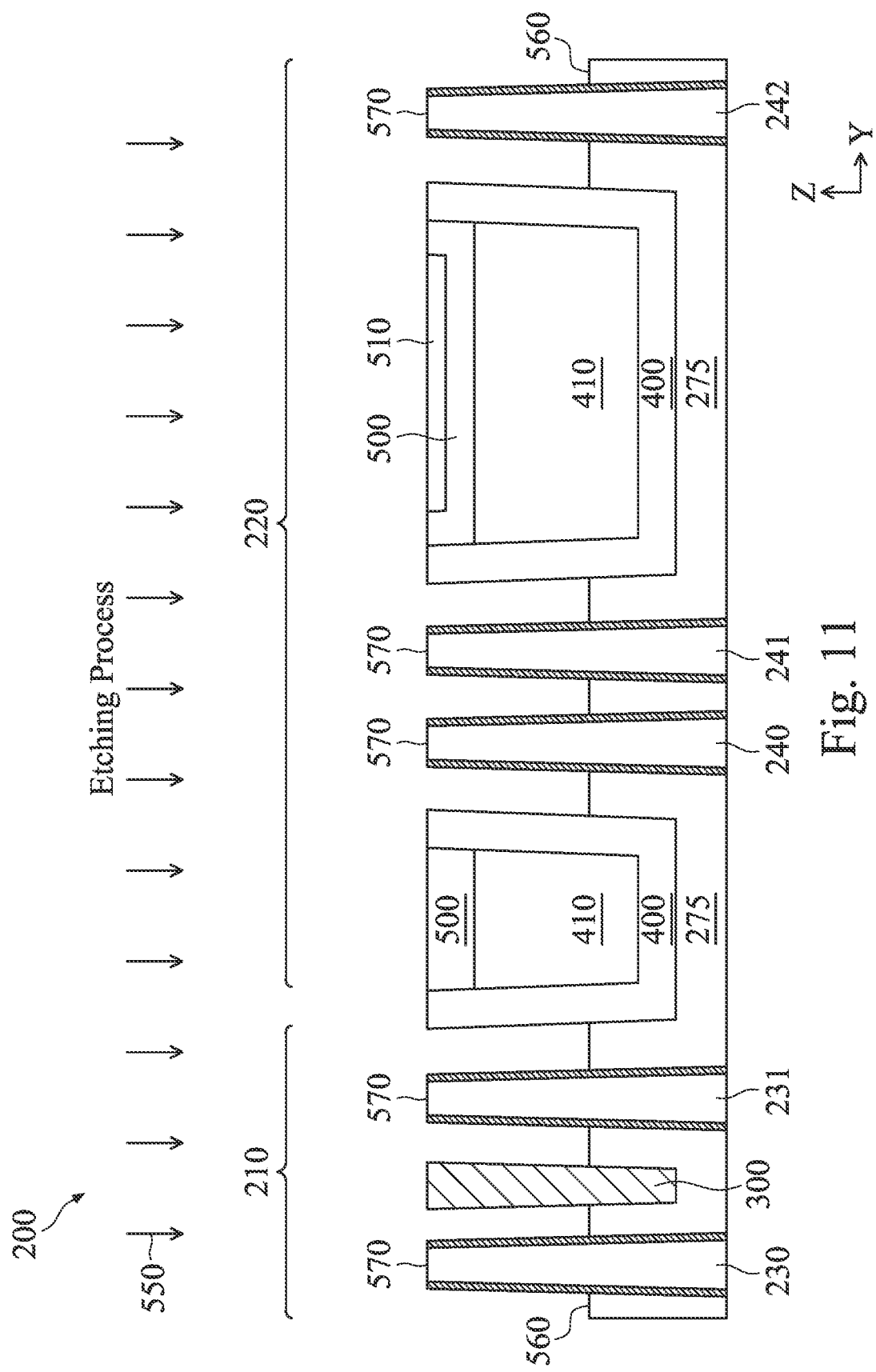

Referring now to FIG. 11, an etching process 550 is performed to the semiconductor device 200 to partially remove the layer 275. In some embodiments, the etching process 550 is performed such that an upper surface 560 of the remaining portion of the layer 275 is disposed substantially below an upper surface 570 of the fin structures 230-231 and 240-242.

Figure 12:
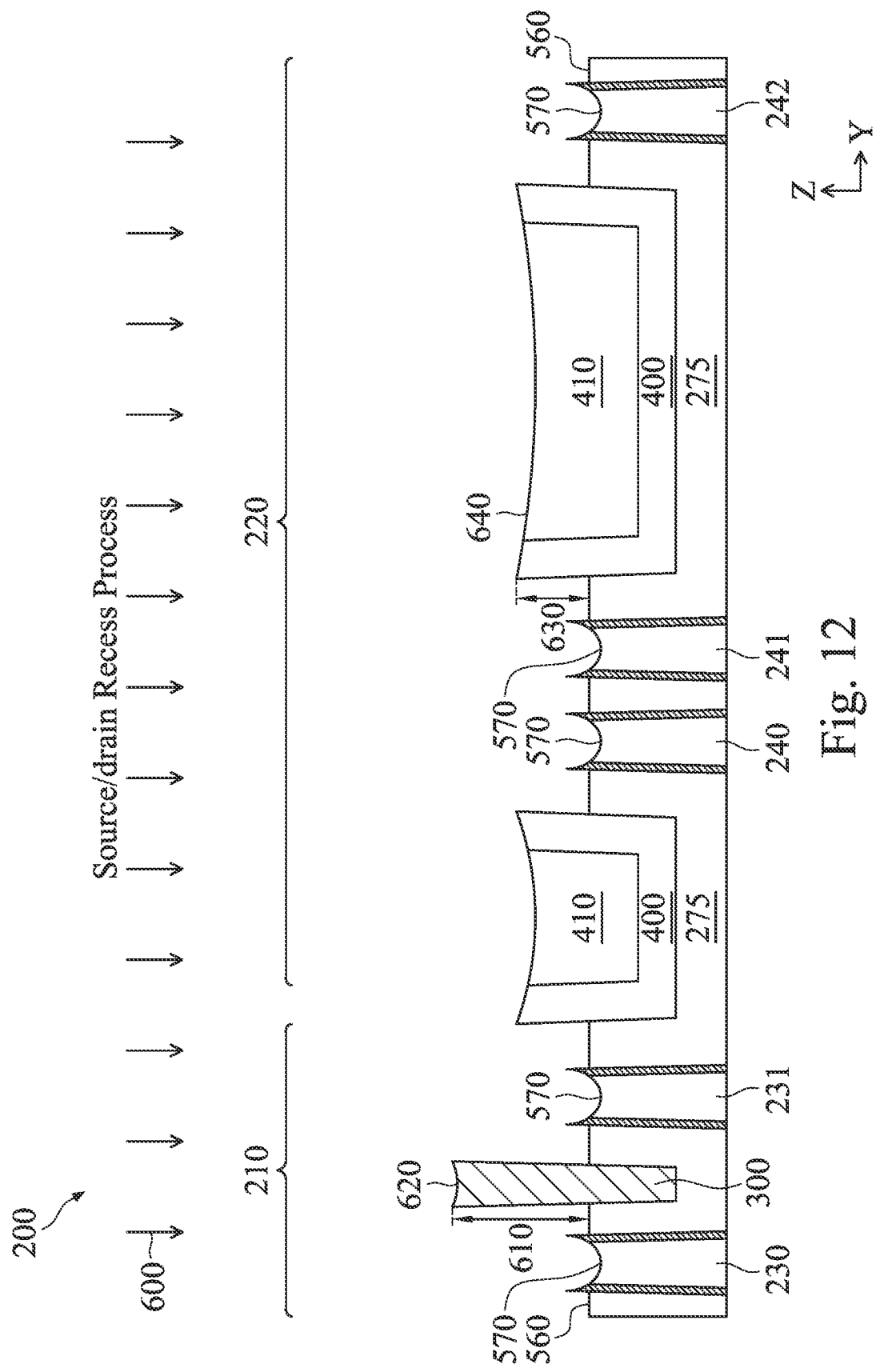

Referring now to FIG. 12, a source/drain recess process 600 is performed to the semiconductor device 200 to partially remove fin structures 230-231 and 240-242. The portions of the fin structures 230-231 and 240-242 removed are located outside a gate structure, where the gate structure may be similar to the gate electrode 110 of FIG. 1. Source/drain regions will be formed on the remaining portions of the fin structures 230-231 and 240-242. The remaining portions of the layer 400-410 constitute a hybrid fin, since it is a hybrid structure that includes both the layer 400 and the layer 410. Compared to the high-k fin 300, the hybrid fin 400-410 is shorter, wider (e.g., at least twice as wide), and has a lower dielectric constant. In addition, whereas the high-k dielectric fin 300 may comprise a single dielectric material, the hybrid fin 400-410 may include multiple types of dielectric materials that each have a different dielectric constant (all lower than the dielectric constant of the high-k fin 300).

In some embodiments, the source/drain recess process 600 includes one or more etching processes. The etching processes are configured to have etching selectivities between the fin structures 230-231, 240-242, the hybrid fin 400-410, and the high-k fin 300. For example, the fin structures 230-231 and 240-242 are etched away at a first rate, the hybrid fin 400-410 are etched away at a second rate, and the high-k fin 300 is etched away at a third rate, where the first rate is greater than the second rate, and the second rate is greater than the third rate. Stated differently, the fin structures 230-231 and 240-242 are etched away the fastest, the high-k fin 300 is etched away the slowest, and the hybrid fins 400-410 are etched away at a rate somewhere in the middle.

Consequently, after the performance of the source/drain recess process 600, the fin structures 230-231 and 240-242 are substantially etched down to a level near the upper surface 560 of the layer 275, while the high-k fins 300 are substantially intact. The hybrid fins 400-410 have a greater reduction in height compared to the high-k fin 300, but not as much as the fin structures 230-231 and 240-242. As shown in FIG. 12, a distance (or height) 610 separates the upper surface 560 of the layer 275 and a tallest point of an upper surface 620 (which may exhibit a "dishing" or curved profile) of the high-k fin 300, and a distance 630 (or height)

separates the upper surface 560 of the layer 275 and a tallest point of an upper surface 640 (which may also exhibit a "dishing" profile) of the hybrid fin 400-410. As a result of the different etching rates discussed above, the distance 610 is substantially greater than the distance 630. For example, a ratio between the distance 610 and the distance 630 is in a range from about 20:1 to about 1.5:1. In other embodiments, the distance 610 may be substantially equal to (or no less than) the distance 630. As discussed in more detail below, the taller high-k fin 300 allows it to prevent undesirable merging between adjacent epitaxially grown source/drains in the memory device region 210, while the shorter hybrid fin 400-410 means that it will not constrain the lateral epitaxial growth of the source/drains in the logic device region 220. Thus, the present disclosure can achieve two different objectives simultaneously for different regions of an IC.

Figure 13:
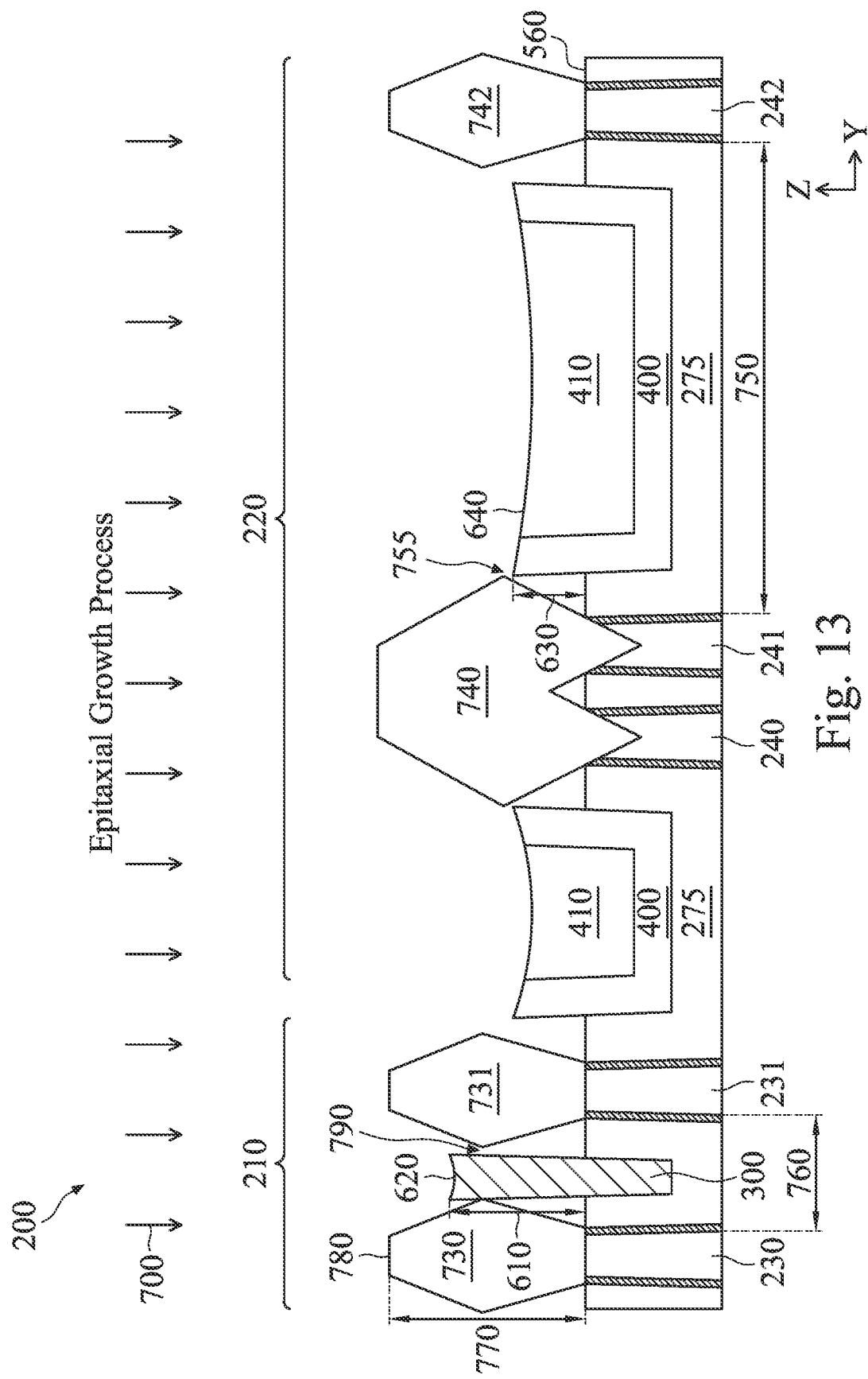

Referring now to FIG. 13, an epitaxial growth process 700 may be performed to the semiconductor device 200, so that source/drain epi-layers 730-731, 740, and 742 are epitaxially grown on the upper surfaces of the fin structures 230-231, 240-241, and 242, respectively. In some embodiments, the source/drain epi-layers 730-731 and 742 are n-type epi-layers, for example they may contain silicon phosphorous (SiP), whereas the source/drain epi-layer 740 may be a p-type epi-layer, for example it may contain silicon germanium (SiGe).

Note that the source/drain epi-layer 740 is formed by two epi-layers that are grown separately on the fin structures 240-242 but that are merged together laterally. The merging of the epi-layers to form the source/drain epi-layer 740 may be intentional and desirable in the illustrated embodiment, since these source/drains do not need to be electrically isolated, and a larger size of the source/drain epi-layer 740 may lead to faster logic device performance. It is undesirable for the source/drain epi-layer 740 to be merged with the source/drain epi-layer 742. However, the risks for the merging between the source/drain epi-layers 740 and 742 are low, since the fin structures 241 and 242 are separated by a relatively long distance 750 laterally in the Y-direction. As such, even though the hybrid fin 400-410 is short and does not substantially prevent the lateral epitaxial growth of the source/drain epi-layers 740 and 742 in the logic device region 220, it is not a problem. The shorter distance 630 (e.g., the height) of the hybrid fin 400-410 also means that it will not unduly interfere with the lateral epitaxial growth of the source/drain epi-layers 740-742. For example, in some embodiments, the tallest point of the upper surface 640 of the hybrid fin 400-410 is still located below an outermost lateral protrusion 755 of the source/drain epi-layers 740 or 742. Note that the upper surface 640 is also disposed below the upper surface 620.

It is desirable for the source/drain epi-layers 740-742 to have larger sizes in order to improve device performance in the logic device region 220. For example, the I/O devices in the logic device region 220 may need larger sizes to handle the input/out signals, which may have large swings. As another example, the larger source/drain epi-layers may increase epi-stress, which could improve device performance. As a further example, the larger source/drain epi-layers may result in a greater surface area for reduced silicide resistance, which may increase device speed. As yet another example, the larger source/drain epi-layers corresponds to a larger landing area or window for conductive source/drain contacts to be formed thereon. For these reasons, it is beneficial not to constrain the lateral epitaxial growth of the source/drain epi-layers 740-742 in the logic device region 220. The present disclosure achieves this objective by making sure that the hybrid fin 400-410 is sufficiently short, for example shorter than the outermost lateral protrusion 755 of the source/drain epi-layers 740-742.

At the same time, the relatively tall high-k fin 300 can substantially prevent the undesirable lateral merging between the adjacently located source/drain epi-layers 730-731. For example, as shown in FIG. 13, a distance 770 separates an upper surface 780 of epi-layers 730-731 and the upper surface 560 of the layer 275. The distance 770 may be greater than the distance 610, but the distance is long enough (alternatively stated, the high-k fin 300 is tall enough), such that the upper surface 620 of the high-k fin 300 is disposed above (or taller than) an outermost lateral protrusion 790 of the source/drain epi-layers 730-731. Thus, the high-k fin 300 can effectively prevent the undesirable lateral merging of the source/drain epi-layers 730-731.

The different dielectric constants between the high-k fin 300 and the hybrid fin 400-410 also improves performance of the semiconductor device 200. For example, since a main objective for the memory device region 210 is to prevent bridging (e.g., electrical shorting) between adjacent source/drain epi-layers such as the source/drain epi-layers 730-731, the relatively higher value of the dielectric constant of the high-k fin 300 can improve the electrical isolation between the adjacent source/drain epi-layers. On the other hand, had the hybrid fin 400-410 been implemented with such a high dielectric constant, device performance such as speed would be degraded in the logic device region 220, since device speed is inversely correlated with dielectric constant (e.g., a higher dielectric constant corresponds to a larger capacitance, which decreases speed, particularly in a high frequency application). Since preventing bridging is not an important concern in the logic device region 220, but maintaining a fast speed is an important concern, the present disclosure achieves these objectives in the logic device region 220 by ensuring that the hybrid fins 400-410 have a relatively low dielectric constant.

Figure 14:
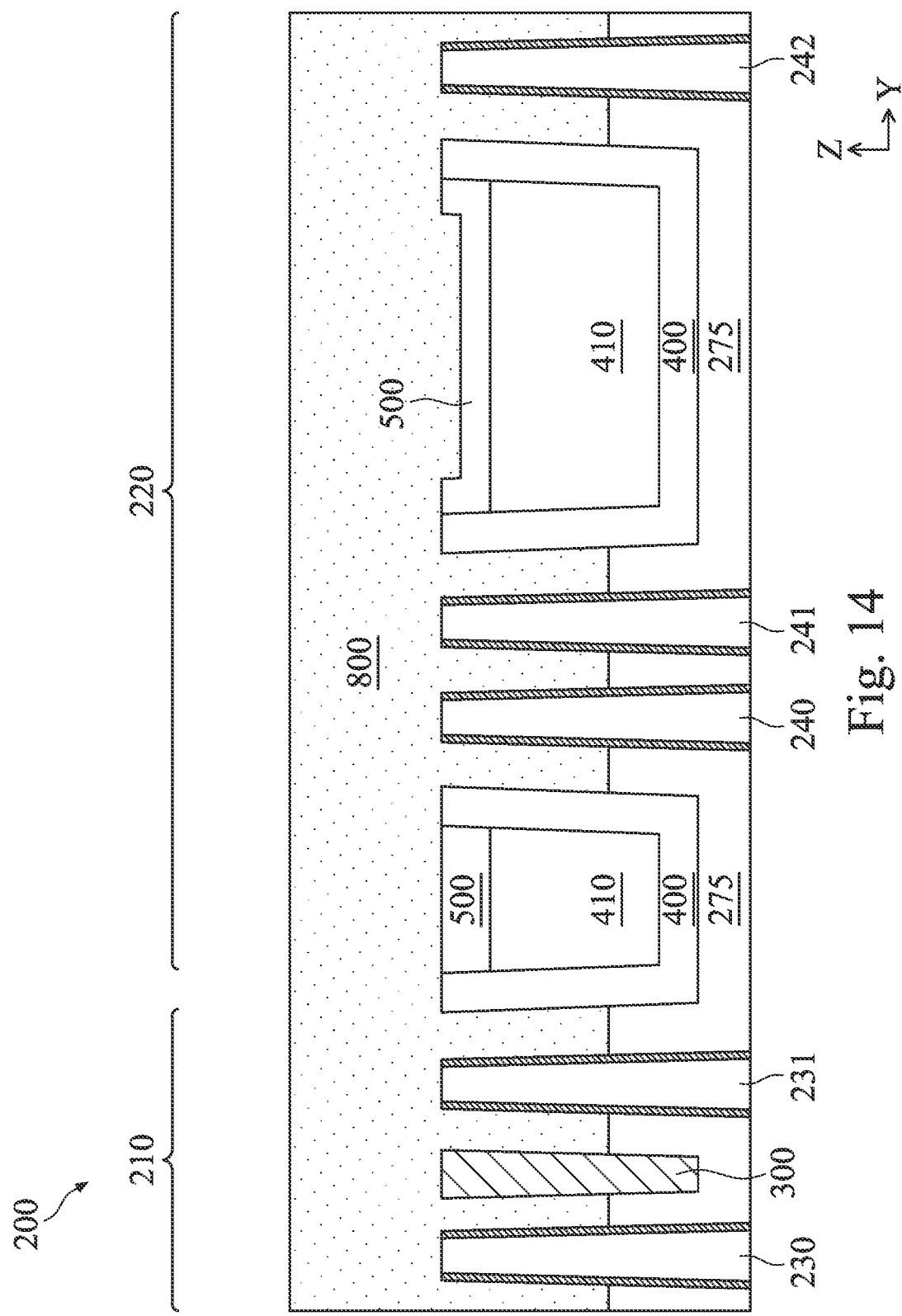

It is understood that FIGS. 2-13 discussed above illustrate a series of cross-sectional views as a "source/drain cut", meaning that the cross-section in these figures are taken along a portion of the source/drain (e.g., on the portion of the semiconductor device 200 corresponding to the cutline A-A' shown in FIG. 1). To further illustrate the device structure of the present disclosure, FIG. 14 illustrates a cross-sectional view with a "gate cut", meaning that the cross-section in FIG. 14 is taken on the gate itself (e.g., on the portion of the semiconductor device 200 corresponding to the cutline B-B' shown in FIG. 1). The stage of fabrication shown in FIG. 14 corresponds to the same stage of fabrication shown in FIG. 13. In other words, the high-k fin 300 and the hybrid fin 400-410 have been formed, the source/drain regions have been recessed, and the source/drain epi-layers 730-731 and 740-742 have already been formed.

Referring to FIG. 14, a gate structure 800 is located over the fin structures 230-231 and 240-242, over the layer 275, and over the high-k fin 300 and the hybrid fin 400-410. The gate structure 800 extends horizontally in the Y-direction and extends vertically upwards in the Z-direction. The gate structure 800 partially wraps around the top and side surfaces of the fin structures 230-231 and 240-242 as well as the high-k fin 300 and the hybrid fins 400-410. The portions of the fin structures 230-231 and 240-242 located directly underneath the gate structure 800 may serve as the channel regions of the respective transistors.

The gate structure 800 may include a gate dielectric and a gate electrode. In some embodiments, the gate dielectric may be a high-k dielectric with a dielectric constant greater than that of silicon oxide, and the gate electrode may be a metal gate electrode. The metal gate electrode may be formed by a gate replacement process in which a dummy polysilicon gate electrode is formed first and later removed, and a metal gate electrode is formed in place of the removed dummy polysilicon gate electrode. The metal gate electrode may include a work function metal configured to tune a work function, as well as a fill metal that serves as the main conducting portion of the metal gate electrode.

Note that the hybrid fin 400-410 under the gate 800 may also include the layer 500. This is because the portion of the layer 500 under the gate structure 800 is not removed by the source/drain recess process 600 discussed above with reference to FIG. 12. As such, it may be said that the hybrid fin under the gate 800 includes three layers: the layers 400, 410, and 500. Since the layer 500 still has a relatively low dielectric constant, the overall dielectric constant of the hybrid fin 400-410 and 500 under the gate 800 is still smaller than the dielectric constant of the high-k fin 300.

Figure 15:
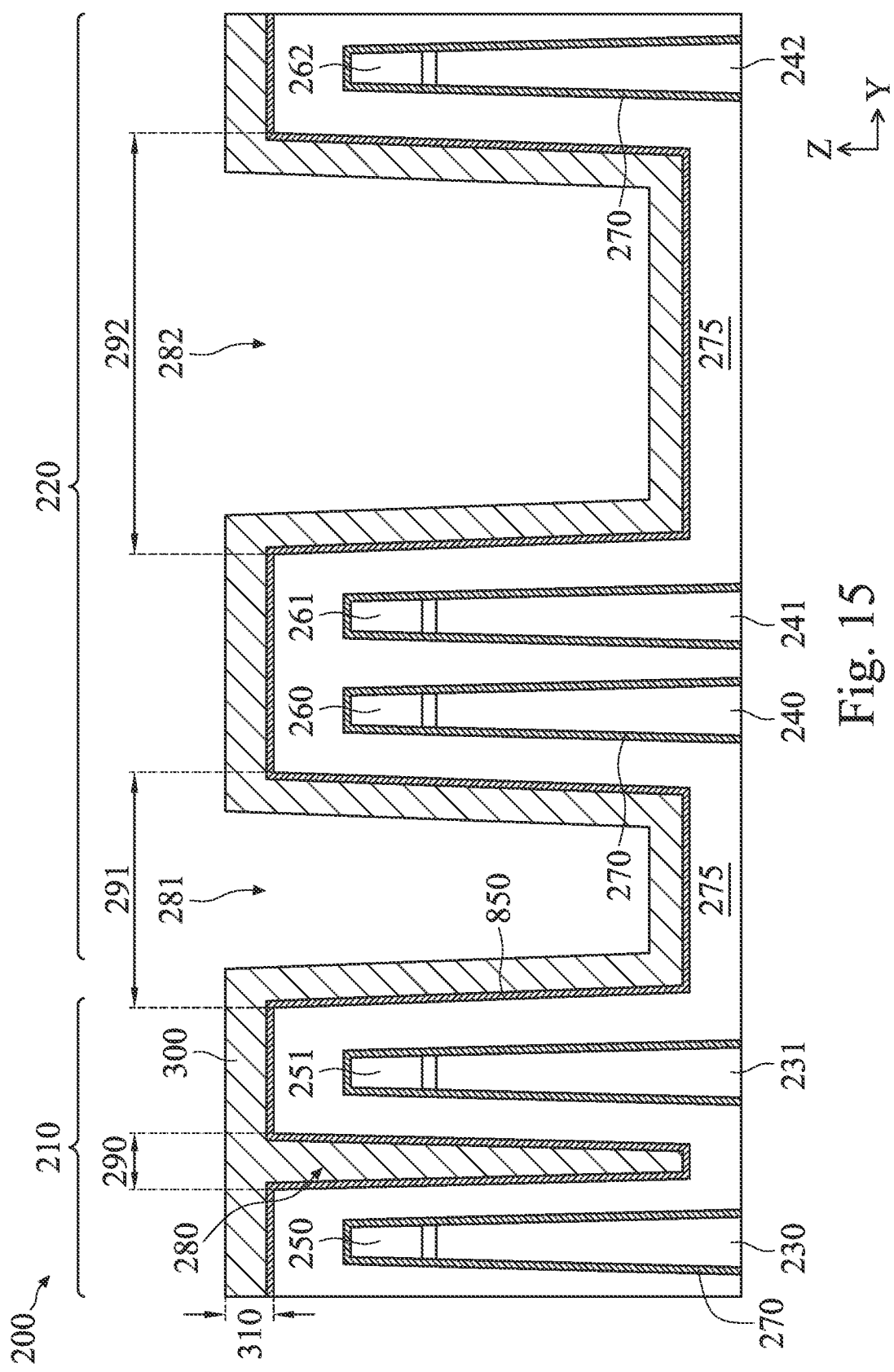

FIG. 15 illustrates an alternative embodiment of the semiconductor device 200. The stage of fabrication shown in FIG. 15 corresponds to the stage of fabrication shown in FIG. 2. For reasons of consistency and clarity, similar components appearing in both FIGS. 2 and 15 will be labeled the same. One difference between the embodiment shown in FIG. 2 and the embodiment shown in FIG. 15 is that an extra layer 850 is formed in the embodiment shown in FIG. 15. The layer 850 may include a dielectric layer in some embodiments. The layer 850 is formed between the layer 275 and the layer 300. In other words, the layer 850 is formed to partially fill in the trenches 280-282 before the deposition of the layer 300. As such, the widths or lateral dimensions 290-292 of the trenches 280-282 can be controlled (e.g., reduced) by configuring a thickness of the layer 850, which means the aspect ratio (e.g., height over width) of the trenches 280-282 can also be more finely controlled. Following the deposition of the layer 300, the same processing steps discussed above with reference to FIGS. 2-14 may be performed to the alternative embodiment shown in FIG. 15. Therefore, the alternative embodiment will have a substantially similar device 200 as the main embodiment discussed above, except with the addition of the layer 850 in the final structure.

Figure 16:
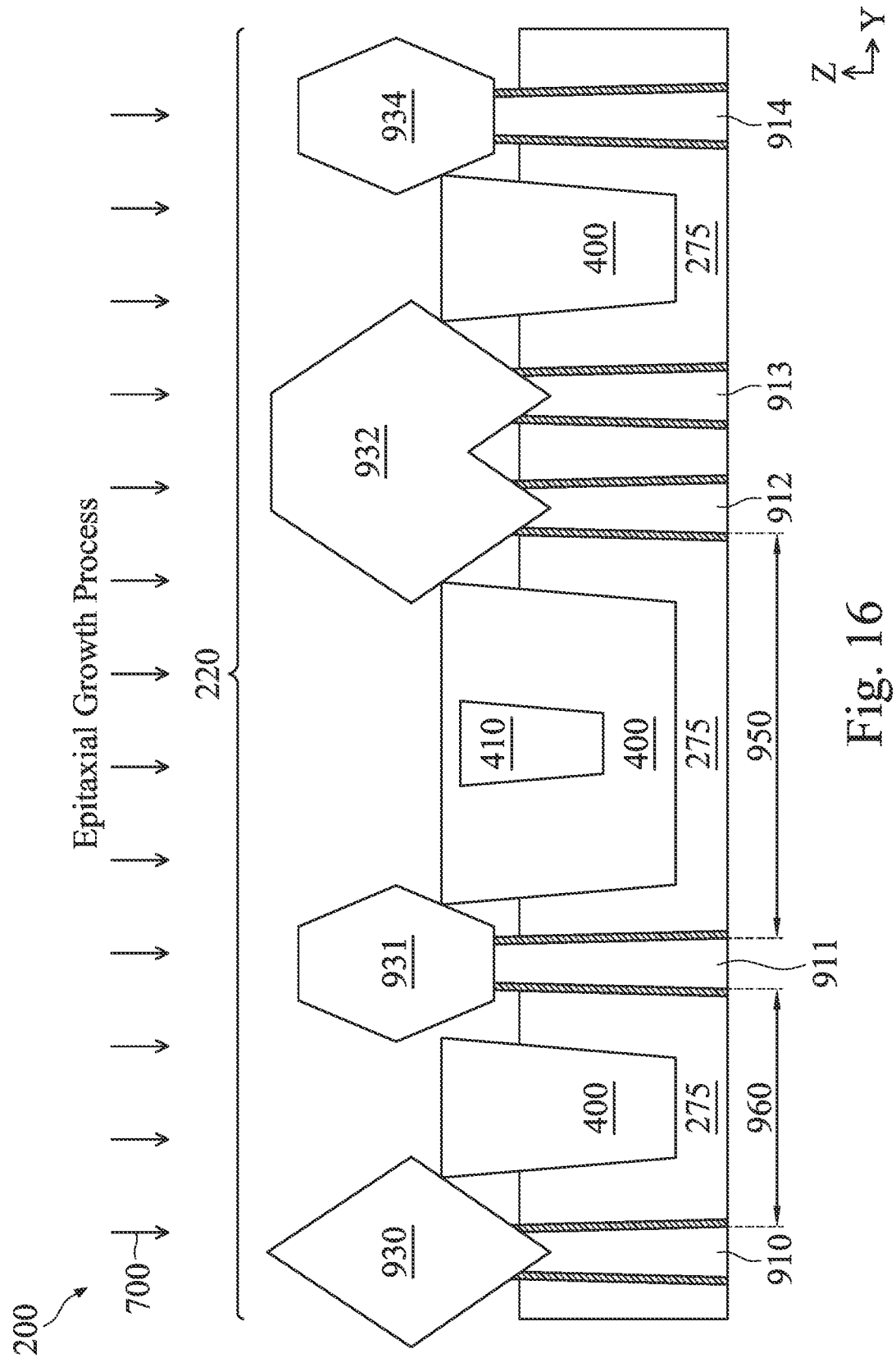

FIG. 16 illustrates yet another alternative embodiment of the present disclosure. The logic device region 220 (but not the memory device region 210) is shown in this alternative embodiment. The stage of fabrication shown in FIG. 16 corresponds to the stage of fabrication shown in FIG. 13, where the epitaxial growth process 700 is performed to form source/drain epi-layers 930, 931, 932, and 934 on fin structures 910, 911, 912-913, and 914, respectively. In some embodiments, the fin structures 910, 912, and 913 may be PMOS fins, while the fin structures 911 and 914 may be NMOS fins. Therefore, the source/drain epi-layers 930 and 932 may be SiGe epi-layers, whereas the source/drain epi-layers 931 and 934 may be SiP epi-layers.

The fin structures 911 and 912 are separated by a distance 950, while the fin structures 910 and 911 are separated by a distance 960 smaller than the distance 960. Due to the difference between the distances 950 and 960, the hybrid fin structure 400-410 may still be formed between the source/drain epi-layers 931-932, similar to the embodiment shown in FIG. 13. However, since the distance 960 is small, the dielectric structure formed between the source/drain epi-layers 930-931 may include just the layer 400 but not the layer 410. This is because the small distance 960 relative to the thickness of the layer 400 causes the layer 400 to completely fill the trench (similar to the trench 281) during the deposition process 390 discussed above with reference to FIG. 6. Thus, the layer 410 would not have been formed to fill in such a trench, and consequently the resulting dielectric structure between the source/drain epi-layers 930-931 does not include the layer 410.

Figure 17A:
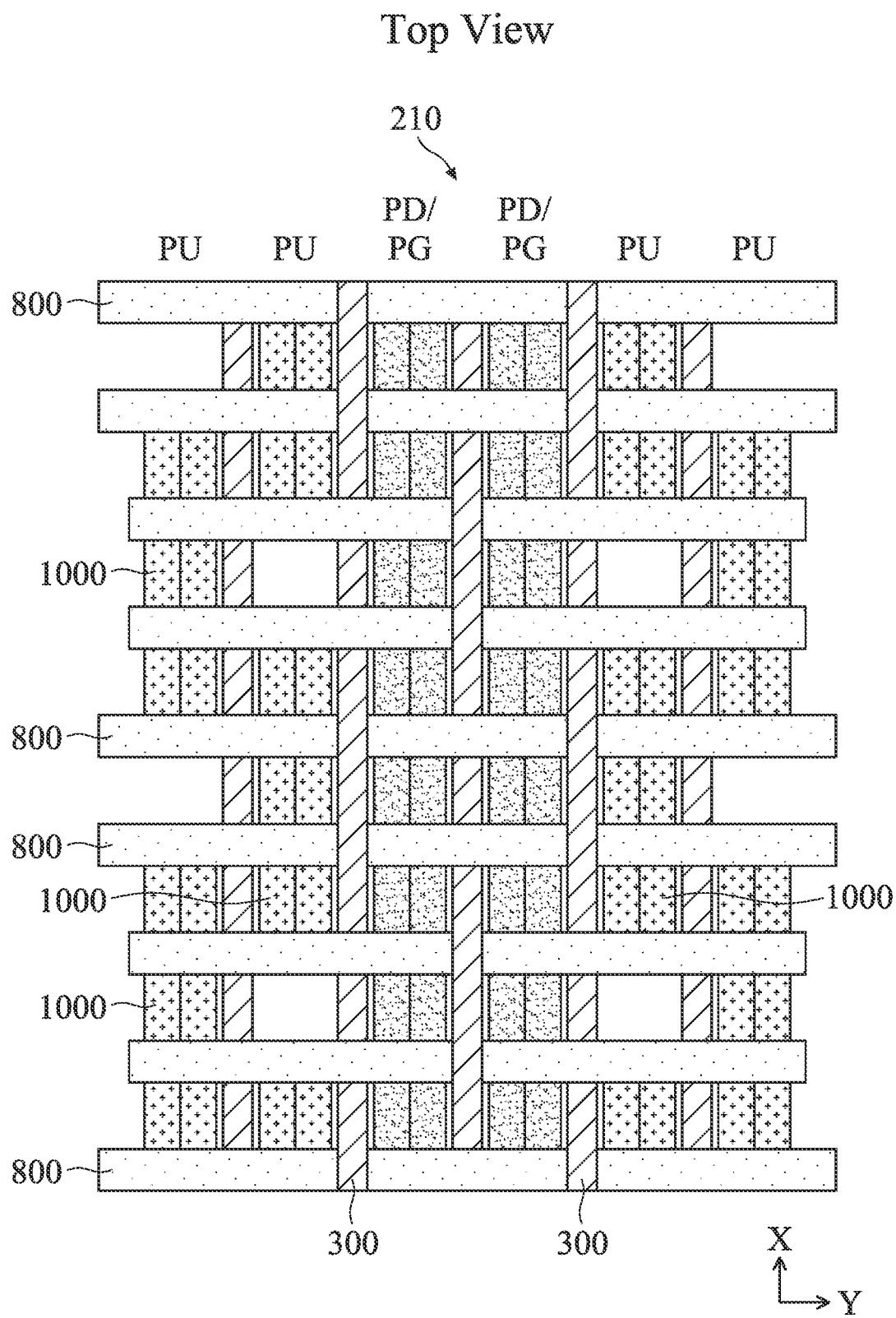
FIGS. 17A-17B illustrate top views of a semiconductor device according to embodiments of the present disclosure.
Figure 17B:
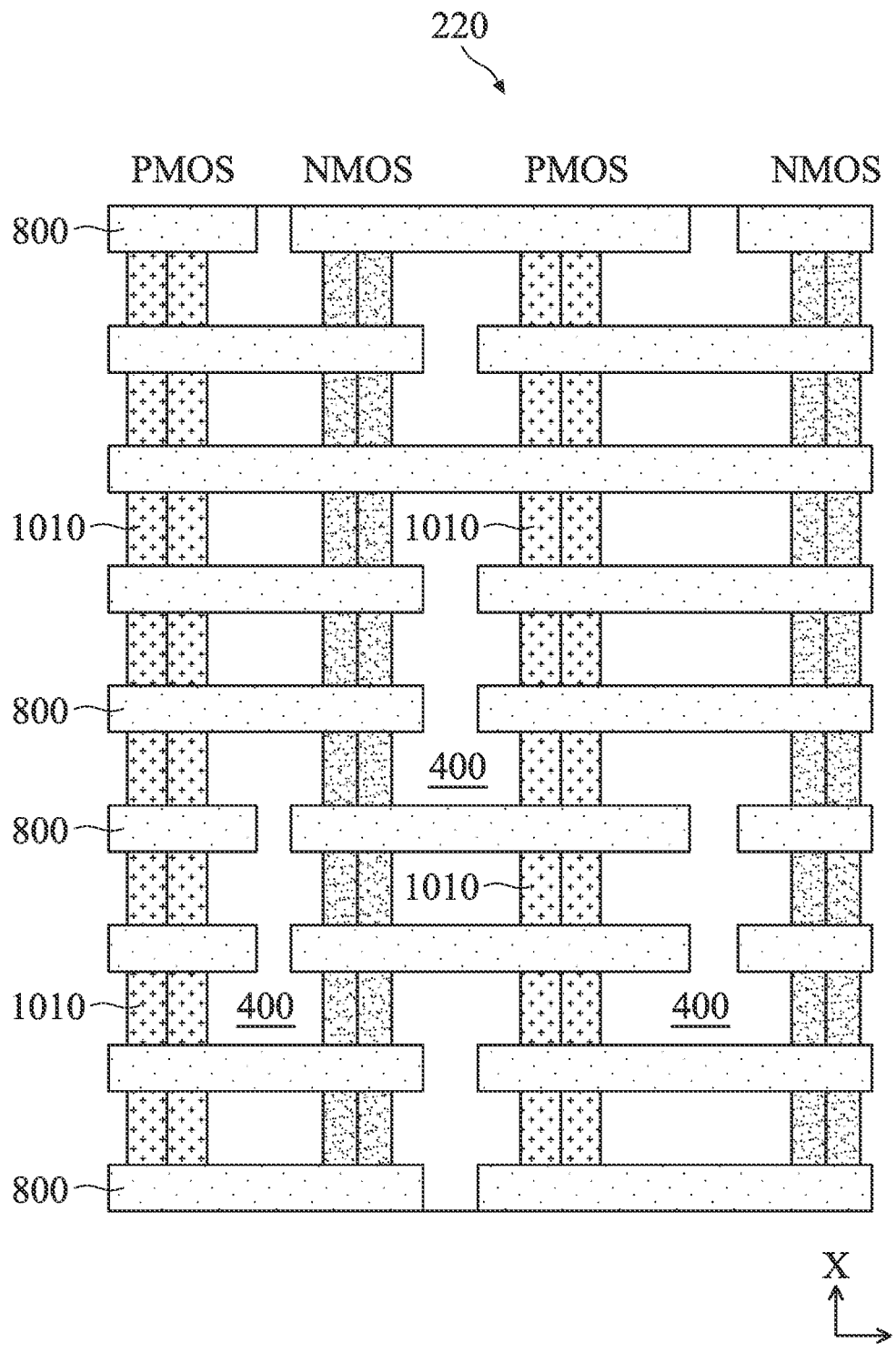

FIG. 17A illustrates a top view of a portion of the memory device region 210, and FIG. 17B illustrates a top view of a portion of the logic device region 220. In some embodiments, the memory device region 210 may include an SRAM device, which includes pull-up transistors PU1, PU2, pull-down transistors PD1, PD2, and pass-gate transistors PG1, PG2. The logic device region 220 includes various PMOS and NMOS transistors. For both the SRAM and the logic devices, they include a plurality of gate structures 800, which are shown as elongated structures extending in the Y-direction. The SRAM device includes a plurality of source/drain epi-layers 1000, which may be similar to the source/drain epi-layers 730-731 discussed above. The logic device includes a plurality of source/drain epi-layers 1010, which may be similar to the source/drain epi-layers 740-742 discussed above.

The SRAM device further includes a plurality of high-k fins 300 that each extend in an elongated manner in the X-direction. As shown in FIG. 17A, the high-k fins 300 separate the source/drain epi-layers 1000 in the Y-direction. Meanwhile, the logic device further includes a plurality of hybrid fins 400 (which could also include the layer 410 and/or the layer 500, which are not shown herein for reasons of simplicity) that each extend in an elongated manner in the X-direction. As shown in FIG. 17B, the hybrid fins 400 separate the source/drain epi-layers 1010 in the Y-direction. As discussed above, due to the differences in size and dielectric constants between the high-k fins 300 and the hybrid fins 400, the present disclosure can simultaneously achieve different objectives that are unique to the SRAM device and the logic device, respectively.

Figure 18:
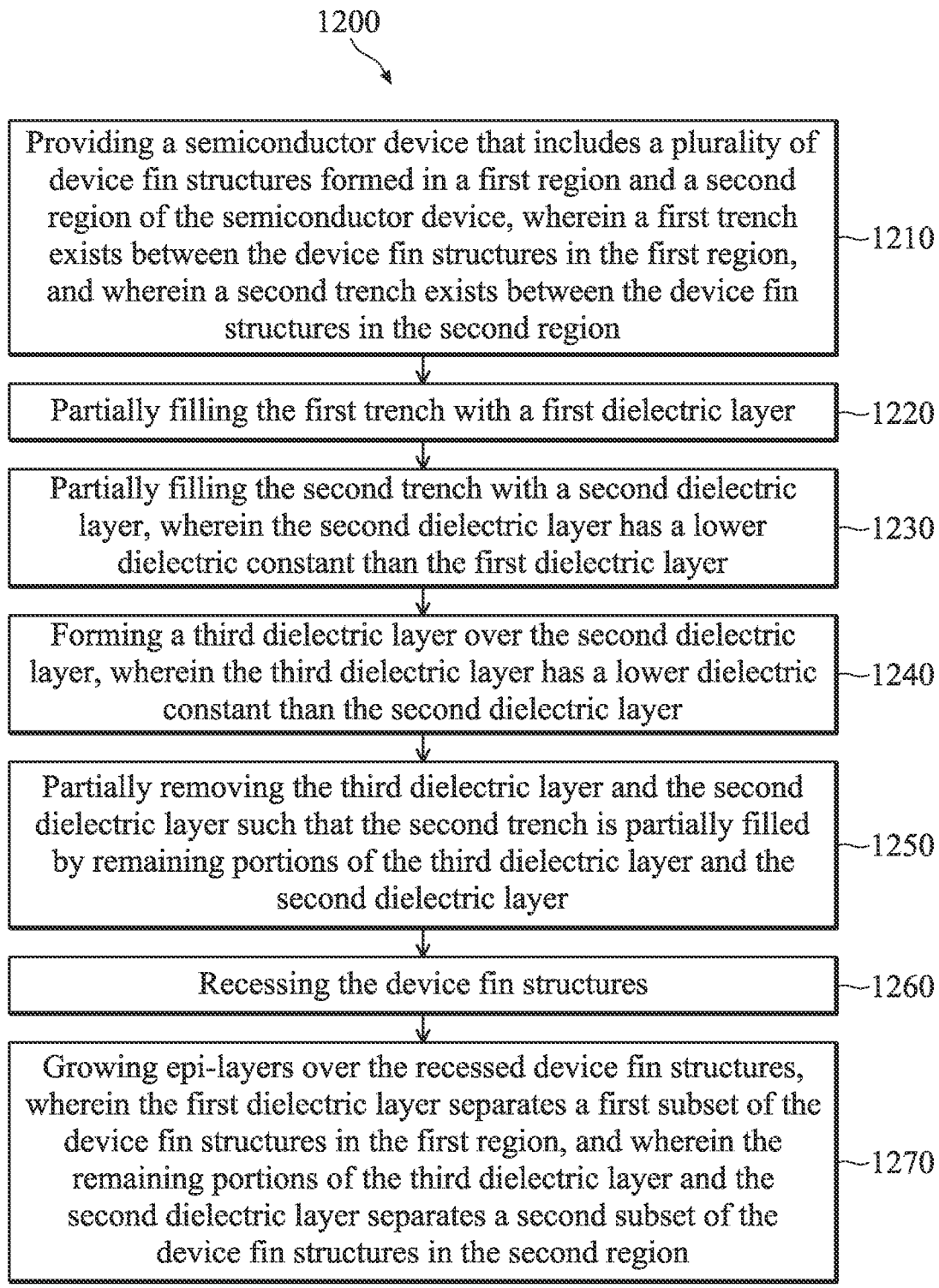
FIG. 18 is a flowchart illustrating a method of fabricating a semiconductor device according to an embodiment of the present disclosure.

FIG. 18 is a flowchart illustrating a method 1200 according to an embodiment of the present disclosure. The method 1200 includes a step 1210 of providing a semiconductor device that includes a plurality of device fin structures formed in a first region and a second region of the semiconductor device. A first trench exists between the device fin structures in the first region. A second trench exists between the device fin structures in the second region. In some embodiments, the first region includes a memory device region and has a first pattern density, the second region includes a logic device region and has a second pattern density, and the first pattern density is greater than the second pattern density.

The method 1200 includes a step 1220 of partially filling the first trench with a first dielectric layer.

The method 1200 includes a step 1230 of partially filling the second trench with a second dielectric layer. The second dielectric layer has a lower dielectric constant than the first dielectric layer.

The method 1200 includes a step 1240 of forming a third dielectric layer over the second dielectric layer. The third dielectric layer has a lower dielectric constant than the second dielectric layer. In some embodiments, the partially removing the third dielectric layer and the second dielectric layer is performed using a planarization process followed by an etch back process.

The method 1200 includes a step 1250 of partially removing the third dielectric layer and the second dielectric layer such that the second trench is partially filled by remaining portions of the third dielectric layer and the second dielectric layer.

The method 1200 includes a step 1260 of recessing the device fin structures. In some embodiments, the recessing the device fin structures is performed using an etching process having a first etching rate with respect to the first dielectric layer, a second etching rate with respect to the second dielectric layer or the third dielectric layer, and a third etching rate with respect to the device fin structures. The first etching rate is less than the second etching rate. The second etching rate is less than the third etching rate. In some embodiments, after the etching process and the growing the epi-layers are performed: the first dielectric layer is shorter than the epi-layers, and the remaining portions of the third dielectric layer and the second dielectric layer are shorter than the first dielectric layer.

The method 1200 includes a step 1270 of growing epi-layers over the recessed device fin structures. The first dielectric layer separates a first subset of the device fin structures in the first region, and wherein the remaining portions of the third dielectric layer and the second dielectric layer separates a second subset of the device fin structures in the second region.

It is understood that additional processes may be performed before, during, or after the steps 1210-1270 of the method 1200. For example, the method 1200 may further include steps performed after the partially removing the third dielectric layer and the second dielectric but before the recessing the device fin structures. The steps may include: forming a fourth dielectric layer over the remaining portions of the third dielectric layer and the second dielectric layer, forming a fifth dielectric layer over the fourth dielectric layer, wherein the fifth dielectric layer has a lower dielectric constant than the fourth dielectric layer, and performing a planarization process to the fifth dielectric layer and the fourth dielectric layer until the device fin structures are reached. For reasons of simplicity, other additional steps are not discussed herein in detail.

In summary, the present disclosure forms dielectric dummy structures in FinFET fabrication. The dielectric fins are formed in both a sparse region with relatively low pattern density and a dense region with relatively high pattern density. The pattern densities are catered to different types of devices. For example, the devices in the sparse region may include logic devices or I/O devices where performance (e.g., speed, power, etc.) or process window (e.g., contact landing area) are more valuable than having a high transistor density. In comparison, the devices in the dense region may include memory devices (e.g., SRAM) or other types of logic devices where a high transistor density may be valued over performance. According to embodiments of the present disclosure, the dielectric fins in the dense region have a taller height and a greater dielectric constant than the dielectric fins in the sparse region, so as to simultaneously optimize different objectives for the dense and sparse regions.

Based on the above discussions, it can be seen that the present disclosure offers advantages over conventional FinFET devices. It is understood, however, that other embodiments may offer additional advantages, and not all advantages are necessarily disclosed herein, and that no particular advantage is required for all embodiments. One advantage is that the shorter height the dielectric fins (which may be a hybrid structure) in the sparse region allows the source/drain epi-layers in the sparse region to not be otherwise constrained by the dielectric fins. Bridging is unlikely to occur anywhere in the sparse region, since the device fins (and therefore the epi-layers grown thereon) are sufficiently spaced apart from one another. The full growth of the source/drain epi-layers in the sparse region optimizes parameters such as epi-stress, larger surface area for silicide formation, increased contact landing window, etc., thereby enhancing the performance of the devices in the sparse region. Another advantage is that electrical bridging is still prevented in the dense region, since dielectric fins in the dense region are still tall enough to block the lateral merging of source/drain epi-layers. Furthermore, the different dielectric constants of the dielectric fins in the sparse and dense regions help to optimize performance as well. For example, the relatively low dielectric constant of the dielectric fin in the sparse region means that the parasitic capacitance will be lower, which results in a faster device speed, especially for high frequency applications. Meanwhile, the relatively high dielectric constant of the dielectric fin in the dense region means that these dielectric fins are more effective at providing electrical isolation for the adjacent source/drain epi-layers in the dense region. In this manner, the present disclosure simultaneously alleviates the different concerns and optimizes different criteria for devices in both the sparse region and the dense region. Other advantages include compatibility with existing FinFET fabrication, so the present disclosure does not require additional processing and is therefore easy and cheap to implement.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure pertains to a semiconductor device. The semiconductor device includes: a first epi-layer and a second epi-layer each located in a first region of the semiconductor device; a first dielectric fin located between the first epi-layer and the second epi-layer, wherein the first dielectric fin has a first dielectric constant; a third epi-layer and a fourth epi-layer each located in a second region of the semiconductor device; and a second dielectric fin located between the third epi-layer and the fourth epi-layer, wherein the second dielectric fin has a second dielectric constant that is less than the first dielectric constant.

Another aspect of the present disclosure pertains to a semiconductor device. The semiconductor device includes: a first source/drain and a second source/drain disposed in a memory device region of the semiconductor device; a high-k fin structure disposed between the first source/drain and the second source/drain; a third source/drain and a fourth source/drain disposed in a logic device region of the semiconductor device; and a hybrid fin structure disposed between the third source/drain and the fourth source/drain. The first source/drain and the second source/drain are spaced apart by a first distance. The third source/drain and the fourth source/drain are spaced apart by a second distance greater than the first distance. The high-k fin structure has a greater dielectric constant than the hybrid fin structure. An upper surface of the high-k fin structure is disposed above an upper surface of the hybrid fin structure. The hybrid fin structure comprises multiple types of different dielectric materials.

Yet another aspect of the present disclosure pertains to a method of fabricating a semiconductor. The method includes: providing a semiconductor device that includes a plurality of device fin structures formed in a first region and a second region of the semiconductor device, wherein a first trench exists between the device fin structures in the first region, and wherein a second trench exists between the device fin structures in the second region; partially filling the first trench with a first dielectric layer; partially filling the second trench with a second dielectric layer, wherein the second dielectric layer has a lower dielectric constant than the first dielectric layer; forming a third dielectric layer over the second dielectric layer, wherein the third dielectric layer has a lower dielectric constant than the second dielectric layer; partially removing the third dielectric layer and the second dielectric layer such that the second trench is partially filled by remaining portions of the third dielectric layer and the second dielectric layer; recessing the device fin structures; and growing epi-layers over the recessed device fin structures, wherein the first dielectric layer separates a first subset of the device fin structures in the first region, and wherein the remaining portions of the third dielectric layer and the second dielectric layer separates a second subset of the device fin structures in the second region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
    forming a first dielectric layer between a first fin structure and a second fin structure located in a first region of a semiconductor device and between a third fin structure and a fourth fin structure located in a second region of the semiconductor device, wherein the first dielectric layer is prevented from coming into direct contact with the first fin structure or the second fin structure by a material layer;
    etching the first dielectric layer in the second region of the semiconductor device until a portion of the material layer in the second region is exposed;
    after the etching of the first dielectric layer, forming a second dielectric layer between the third fin structure and the fourth fin structure, wherein at least a portion of the second dielectric layer is formed on the material layer, and wherein the second dielectric layer is formed with a different material composition than the first dielectric layer; and
    epitaxially growing a first source/drain a second source/drain, a third source/drain, and a fourth source/drain over the first fin structure, the second fin structure, the third fin structure, and the fourth fin structure, respectively, wherein the first dielectric layer separates the first source/drain from the second source/drain, and wherein the second dielectric layer separates the third source/drain from the fourth source/drain.

2. The method of claim 1, wherein:
    the forming the first dielectric layer comprises depositing a first type of dielectric material having a dielectric constant greater than a dielectric constant of silicon oxide; and
    the forming the second dielectric layer comprises depositing a second type of dielectric material having a dielectric constant less than the dielectric constant of silicon oxide.

3. The method of claim 1, wherein the forming the second dielectric layer comprises forming a plurality of different types of dielectric materials as the second dielectric layer.

4. The method of claim 3, wherein the forming the second dielectric layer comprises forming a first type of dielectric material having a dielectric constant in a range between about 4 and about 10 and forming a second type of dielectric material having a dielectric constant in a range between about 3.7 and about 3.9.

5. The method of claim 1, wherein:
    the forming the first dielectric layer comprises filling a first trench between the first fin structure and the second fin structure with the first dielectric layer, the first trench having a first maximum lateral dimension; and
    the forming the second dielectric layer comprises filling a second trench between the third fin structure and the fourth fin structure with the second dielectric layer, the second trench having a second maximum lateral dimension that is at least twice as long as the first maximum lateral dimension.

6. The method of claim 5, wherein the filling the first trench further comprises partially filling the second trench with the first dielectric layer, and wherein the method further comprises removing portions of the first dielectric layer in the second trench before the second trench is filled with the second dielectric layer.

7. The method of claim 5, further comprising:
    before the second trench is filled, performing a first etching process that reduces a height of the first dielectric layer to a first height; and
    after the second trench is filled, performing a second etching process that reduces a height of the second dielectric layer to a second height that is less than the first height, wherein the first dielectric layer is protected by a protective mask while the second etching process is performed.

8. The method of claim 1, wherein the first dielectric layer is formed at least in part via a deposition process.

9. The method of claim 1, further comprising: before the epitaxially growing, partially removing the first fin structure, the second fin structure, the third fin structure, and the fourth fin structure, such that upper portions of the first fin structure, the second fin structure, the third fin structure, and the fourth fin structure are recessed.

10. The method of claim 1, wherein the epitaxially growing is performed such that:
    the first source/drain, the second source/drain, the third source/drain, and the fourth source/drain each have an outermost lateral protrusion;
    an upper surface of the first dielectric layer is disposed above the outermost lateral protrusions of the first source/drain and the second source/drain; and
    an upper surface of the second dielectric layer is disposed below the outermost lateral protrusions of the third source/drain and the fourth source/drain.

11. The method of claim 1, wherein:
the first fin structure and the second fin structure are components of Static Random Access Memory (SRAM) cells; and
the third fin structure and the fourth fin structure are components of transistors that are not part of memory cells.

12. A method, comprising:
filling a first trench between a first semiconductor structure and a second semiconductor structure with a first dielectric layer, the first dielectric layer having a first dielectric constant;
etching the first dielectric layer, thereby forming a first dielectric structure having a first height;
forming, after the first trench has been filled, a second dielectric structure in a second trench between a third semiconductor structure and a fourth semiconductor structure, wherein the second dielectric structure has a second height and a second dielectric constant, wherein the second trench is wider than the first trench, wherein the second height is lower than the first height, and wherein the second dielectric constant is lower than the first dielectric constant;
recessing, after the second dielectric structure has been formed in the second trench, the first semiconductor structure, the second semiconductor structure, the third semiconductor structure, and the fourth semiconductor structure; and
epitaxially growing a first source/drain, a second source/drain, a third source/drain, and a fourth source/drain over the first semiconductor structure, the second semiconductor structure, the third semiconductor structure, and the fourth semiconductor structure, respectively, wherein an upper surface of the first dielectric structure is more elevated vertically than an outermost lateral portion of the first source/drain or the second source/drain, and wherein an upper surface of the second dielectric structure is less elevated vertically than an outermost lateral portion of the third source/drain or the fourth source/drain.

13. The method of claim 12, wherein:
the filling the first trench comprises depositing a single type of dielectric material into the first trench as the first dielectric structure; and
the forming the second dielectric structure in the second trench comprises depositing multiple different types of dielectric material into the second trench as the second dielectric structure.

14. The method of claim 12, wherein the first semiconductor structure and the second semiconductor structure, but not the third semiconductor structure or the fourth semiconductor structure, are components of Static Random Access Memory (SRAM) cells.

15. A method, comprising:
providing a semiconductor device that includes a plurality of device fin structures formed in a first region and a second region of the semiconductor device, wherein the device fin structures each include a semiconductor material, wherein a first trench exists between the device fin structures in the first region, and wherein a second trench exists between the device fin structures in the second region;
depositing a first dielectric layer in the first trench and the second trench;
etching the first dielectric layer, wherein more of the first dielectric layer is removed from the second trench than from the first trench;
partially filling the second trench with a second dielectric layer, wherein the second dielectric layer has a lower dielectric constant than the first dielectric layer;
forming a third dielectric layer over the second dielectric layer, wherein the third dielectric layer has a lower dielectric constant than the second dielectric layer;
partially removing the third dielectric layer and the second dielectric layer such that the second trench is partially filled by remaining portions of the third dielectric layer and the second dielectric layer;
recessing the device fin structures at least in part by removing a portion of the semiconductor material of the device fin structures; and
growing epi-layers over the recessed device fin structures, wherein the first dielectric layer separates a first subset of the device fin structures in the first region, and wherein the remaining portions of the third dielectric layer and the second dielectric layer separates a second subset of the device fin structures in the second region.

16. The method of claim 15, wherein:
the first region includes a memory device region and has a first pattern density;
the second region includes a logic device region and has a second pattern density; and
the first pattern density is greater than the second pattern density.

17. The method of claim 15, wherein the partially removing the third dielectric layer and the second dielectric layer is performed using a planarization process followed by an etch back process.

18. The method of claim 15, wherein:
the recessing the device fin structures is performed using an etching process having a first etching rate with respect to the first dielectric layer, a second etching rate with respect to the second dielectric layer or the third dielectric layer, and a third etching rate with respect to the device fin structures;
the first etching rate is less than the second etching rate; and
the second etching rate is less than the third etching rate.

19. The method of claim 18, wherein after the etching process and the growing the epi-layers are performed:
the first dielectric layer is shorter than the epi-layers; and
the remaining portions of the third dielectric layer and the second dielectric layer are shorter than the first dielectric layer.

20. The method of claim 15, further comprising, after the partially removing the third dielectric layer and the second dielectric layer but before the recessing the device fin structures:
forming a fourth dielectric layer over the remaining portions of the third dielectric layer and the second dielectric layer;
forming a fifth dielectric layer over the fourth dielectric layer, wherein the fifth dielectric layer has a lower dielectric constant than the fourth dielectric layer; and
performing a planarization process to the fifth dielectric layer and the fourth dielectric layer until the device fin structures are reached.

* * * * *